United States Patent
Giusti et al.

(10) Patent No.: US 11,600,765 B2
(45) Date of Patent: Mar. 7, 2023

(54) PIEZOELECTRIC ACTUATOR HAVING A DEFORMATION SENSOR AND FABRICATION METHOD THEREOF

(71) Applicant: STMICROELECTRONICS S.r.l., Agrate Brianza (IT)

(72) Inventors: Domenico Giusti, Caponago (IT); Carlo Luigi Prelini, Seveso (IT); Marco Ferrera, Concorezzo (IT); Carla Maria Lazzari, Casatenovo (IT); Luca Seghizzi, Milan (IT); Nicolo' Boni, Albino (IT); Roberto Carminati, Piancogno (IT); Fabio Quaglia, Pizzale (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 255 days.

(21) Appl. No.: 17/137,220

(22) Filed: Dec. 29, 2020

(65) Prior Publication Data
US 2021/0351338 A1 Nov. 11, 2021

(30) Foreign Application Priority Data
May 7, 2020 (IT) .................. 102020000010264

(51) Int. Cl.
*H01L 41/09* (2006.01)
*B01L 3/00* (2006.01)
(Continued)

(52) U.S. Cl.
CPC ...... *H01L 41/0973* (2013.01); *B01L 3/50273* (2013.01); *F16K 99/0015* (2013.01);
(Continued)

(58) Field of Classification Search
CPC ... H01L 41/0973; H01L 41/22; H01L 41/332; H01L 41/0825; B01L 3/50273;
(Continued)

(56) References Cited

U.S. PATENT DOCUMENTS 5,473,215 A 12/1995 Luthier
7,084,555 B2 * 8/2006 Bachellerie ......... H01L 41/0973
310/357
(Continued)

FOREIGN PATENT DOCUMENTS

| CN | 102183197 A | 9/2011 |
| CN | 108289270 A | 7/2018 |
| EP | 3490018 | 5/2019 |

OTHER PUBLICATIONS

Bronkhorst® "Mass Flow Controller (MFC) Theory," downloaded on Dec. 17, 2020 from https://www.bronkhorst.com/service-support/technologies/mass-flow-controller-mfc-theory/.
(Continued)

*Primary Examiner* — Minh Q Le
(74) *Attorney, Agent, or Firm* — Seed Intellectual Property Law Group LLP

(57) ABSTRACT

The MEMS actuator is formed by a substrate, which surrounds a cavity; by a deformable structure suspended on the cavity; by an actuation structure formed by a first piezoelectric region of a first piezoelectric material, supported by the deformable structure and configured to cause a deformation of the deformable structure; and by a detection structure formed by a second piezoelectric region of a second piezoelectric material, supported by the deformable structure and configured to detect the deformation of the deformable structure.

21 Claims, 17 Drawing Sheets

(51) Int. Cl.
*F16K 99/00* (2006.01)
*G05D 7/06* (2006.01)
*H01L 41/22* (2013.01)
*H01L 41/332* (2013.01)
*H01L 41/08* (2006.01)
*B81B 7/00* (2006.01)

(52) U.S. Cl.
CPC ....... *F16K 99/0048* (2013.01); *G05D 7/0647* (2013.01); *B81B 7/008* (2013.01); *B81B 2201/038* (2013.01); *B81B 2201/054* (2013.01); *H01L 41/0825* (2013.01); *H01L 41/22* (2013.01); *H01L 41/332* (2013.01)

(58) Field of Classification Search
CPC ............ F16K 99/0015; F16K 99/0048; G05D 7/0647; B81B 2201/054; B81B 2201/038; B81B 7/008
USPC ................................ 251/331; 137/487.5, 831
See application file for complete search history.

(56) References Cited

U.S. PATENT DOCUMENTS

| | | | |
|---|---|---|---|
| 10,433,063 B2* | 10/2019 | Rusconi Clerici Beltrami | H04R 17/00 |
| 2004/0036047 A1* | 2/2004 | Richter | F16K 99/0001 251/129.01 |
| 2004/0187927 A1 | 9/2004 | Kang et al. | |
| 2007/0052765 A1* | 3/2007 | Yasui | B41J 2/161 347/68 |
| 2008/0295308 A1* | 12/2008 | Wijngaards | B41J 2/1646 29/25.35 |
| 2010/0181871 A1* | 7/2010 | Daniel | G01P 15/0802 73/579 |
| 2010/0231659 A1* | 9/2010 | Ohta | H01L 41/0831 310/366 |
| 2011/0018944 A1* | 1/2011 | Yokoyama | H01L 41/047 347/68 |
| 2013/0186078 A1 | 7/2013 | Lemke et al. | |
| 2015/0333727 A1* | 11/2015 | Moulard | H01L 41/314 310/365 |
| 2017/0182778 A1* | 6/2017 | Cattaneo | B41J 2/1629 |
| 2018/0124521 A1* | 5/2018 | Giusti | H04R 31/003 |
| 2018/0190895 A1* | 7/2018 | Giusti | H02N 2/043 |
| 2019/0329551 A1* | 10/2019 | Giusti | B41J 2/1631 |
| 2020/0092655 A1 | 3/2020 | Jiang et al. | |
| 2020/0194659 A1* | 6/2020 | Giusti | B81B 3/0072 |
| 2020/0369023 A1* | 11/2020 | Giusti | H01L 41/314 |
| 2020/0369029 A1* | 11/2020 | Assanelli | B41J 2/161 |
| 2021/0347634 A1* | 11/2021 | Giusti | H04R 19/02 |
| 2021/0395075 A1* | 12/2021 | Giusti | B06B 1/0666 |
| 2021/0405346 A1* | 12/2021 | Giusti | H01L 41/277 |

OTHER PUBLICATIONS

Schiffer et al., "MEMS Mass Flow Controller for Liquid Fuel Supply to HCCI-Driven Engine," Transducers Eurosensors IEEE 2019, 4 pages.
U.S. Appl. No. 17/240,782, filed Apr. 26, 2021.

* cited by examiner

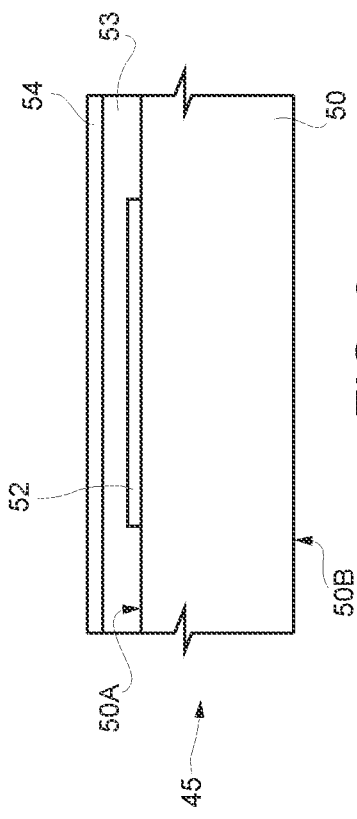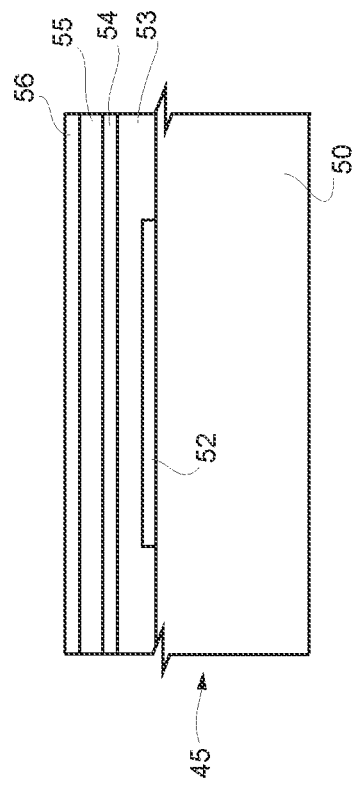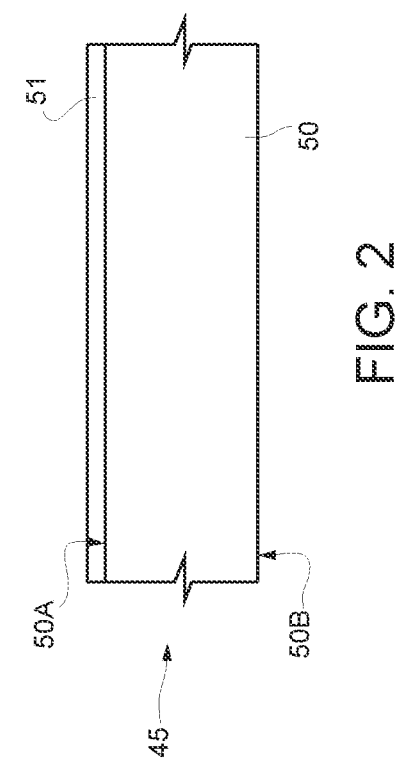

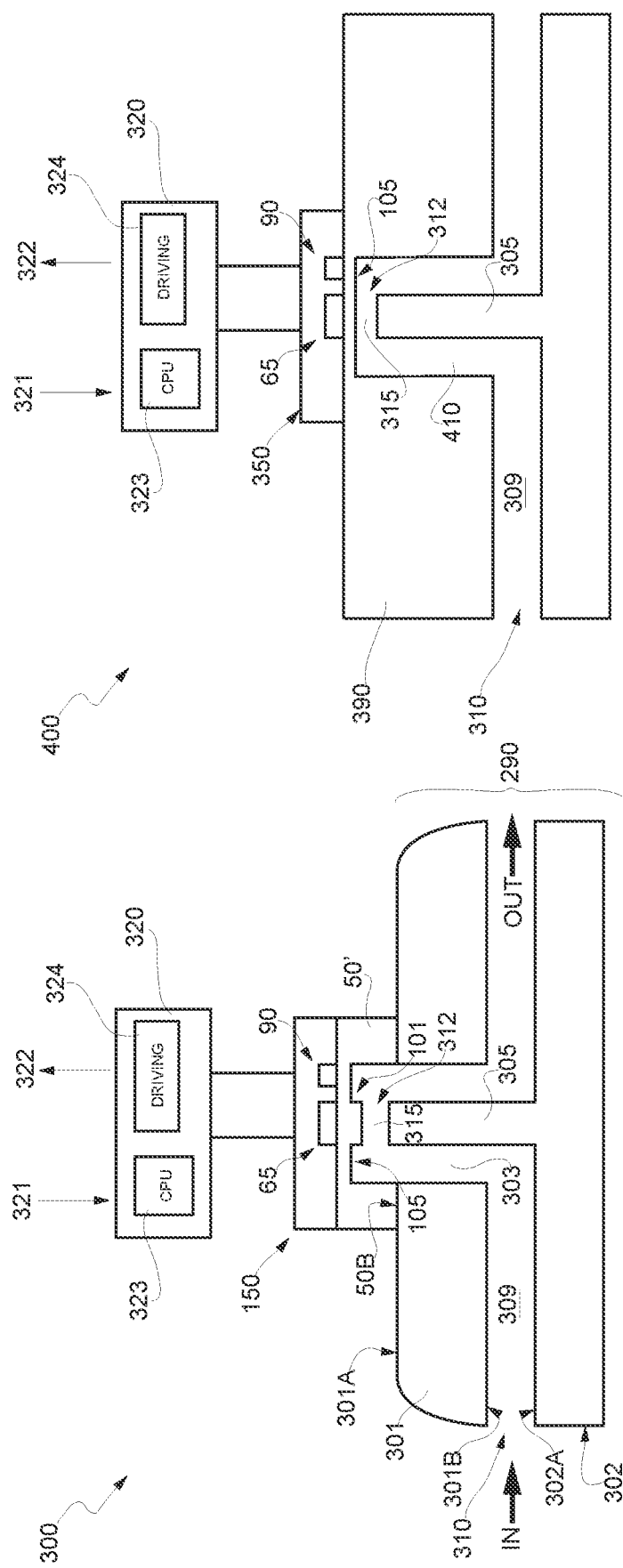

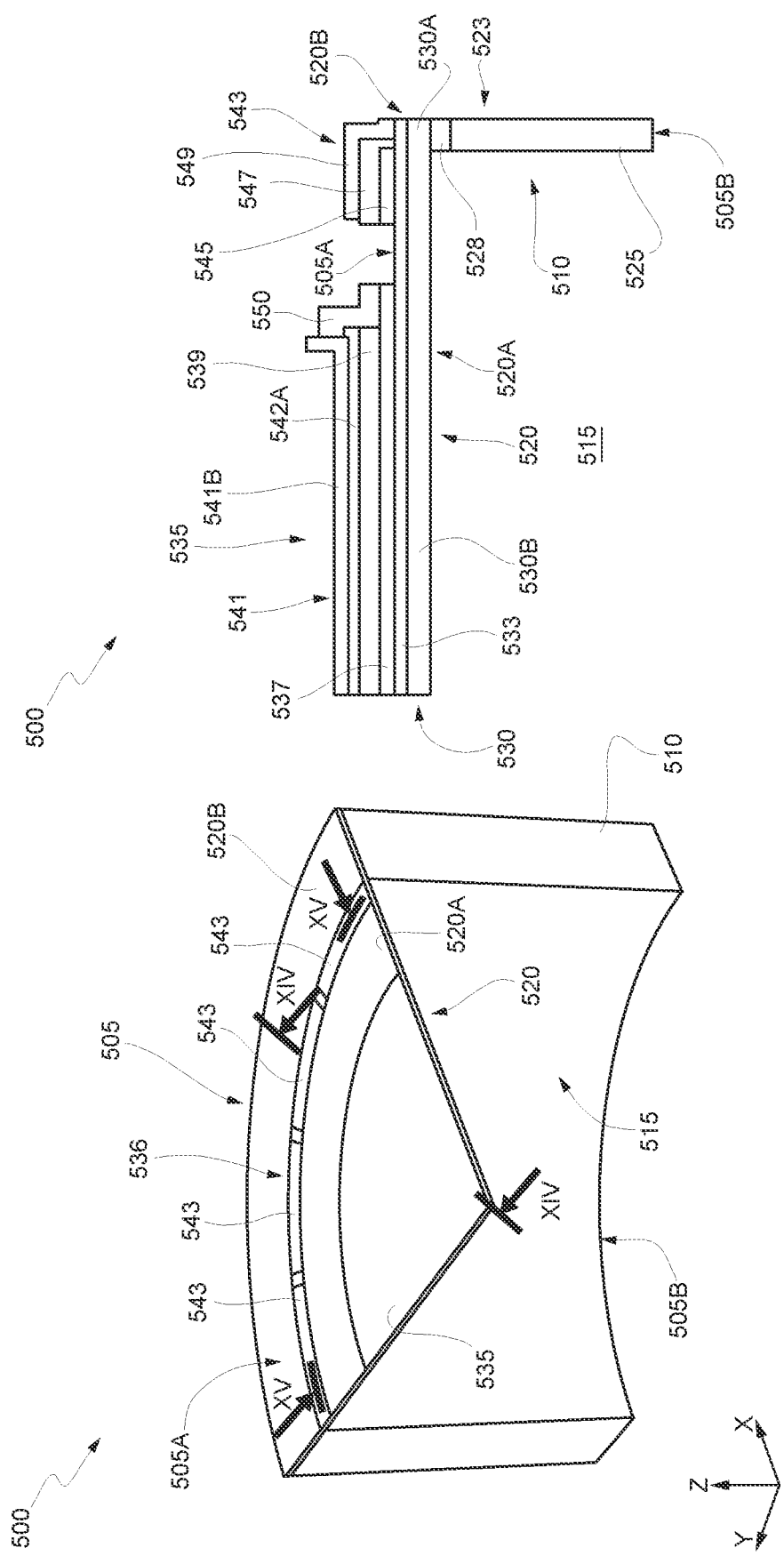

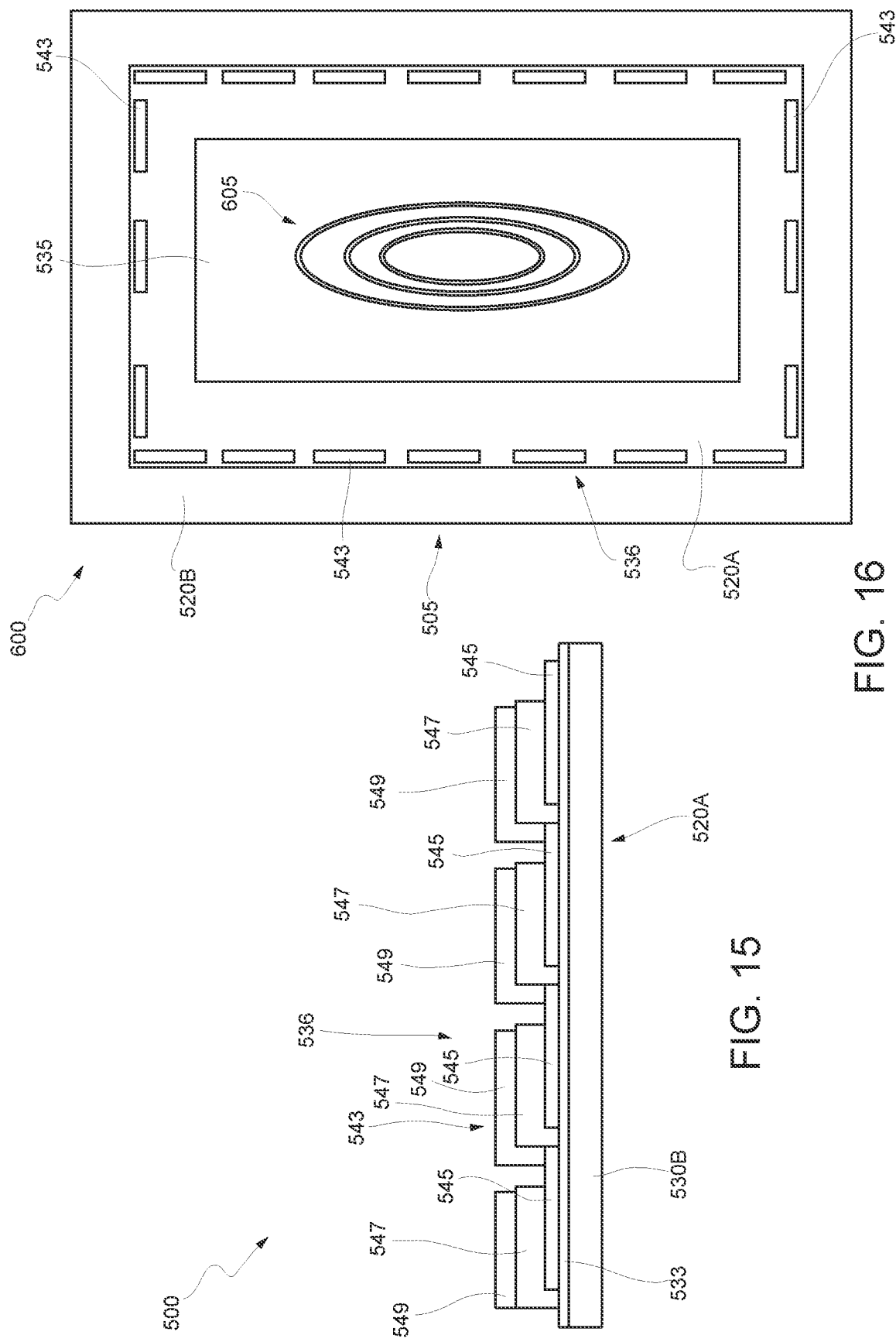

PIEZOELECTRIC ACTUATOR HAVING A DEFORMATION SENSOR AND FABRICATION METHOD THEREOF

BACKGROUND

Technical Field

The present disclosure relates to a piezoelectric actuator having a deformation sensor and to the fabrication method thereof. In particular, reference will be made hereinafter to a piezoelectric actuator made using thin piezoelectric film MEMS (Micro Electro-Mechanical System) technology.

Description of the Related Art

As known, a MEMS actuator is an electronic device typically made from a wafer of semiconductor material, for example, silicon, and able to cause a deformation of a movable element such as a membrane or a cantilever.

A MEMS actuator may operate according to different actuation principles, including electrostatic, electromagnetic and piezoelectric actuation. In detail, the MEMS actuators operating according to the piezoelectric actuation principle are distinguished by the high energy efficiency and the high deformation accuracy of the movable element; for this reason they are increasingly popular. In particular, thin piezoelectric film MEMS actuators are currently used to obtain microfluidic valves, camera devices for focusing and print cartridges.

FIG. 1 shows a cross section of a known piezoelectric MEMS actuator (hereinafter also referred to as actuator 10). The actuator 10 comprises an active actuation structure 15 and a deformable structure 16 suspended on a cavity 12 formed in a body 11 of semiconductor material, for example, silicon.

The deformable structure 16 is arranged below the active actuation structure 15 and is formed by a movable region 17 of semiconductor material, for example, polysilicon, and an insulating region 18, for example, of silicon oxide. The insulating region 18 is arranged above the movable region 17 so as to electrically insulate it from the active actuation structure 15.

The active actuation structure 15 is formed by a piezoelectric region 20, a lower electrode 21 and an upper electrode 22.

The lower electrode 21 is of metal material, for example, platinum, and extends over the deformable structure 16, in contact with the insulating region 18.

The piezoelectric region 20 is formed by piezoelectric material, for example, PZT (lead zirconate titanate), $BaTiO_3$, KNN (potassium sodium niobate), $PbTiO_2$ or $PbNb_2O_6$.

For example, the piezoelectric region 20 has a thickness of a few micrometers, for example, in the range 1-3 µm, and extends over the lower electrode 21.

The upper electrode 22 is of metal material, for example, a titanium-tungsten alloy, and extends over the piezoelectric region 20.

The actuator 10 also comprises a passivation region 25 and an upper connection region 26.

The passivation region 25 is formed here by a stack of insulating layers, for example, three insulating layers, including a first insulating layer 25A, for example, of aluminum oxide, arranged on the active actuation structure 15 and the deformable structure 16, a second insulating layer 25B, for example, of undoped silicon glass (USG) arranged on the first insulating layer 25A, and a third insulating layer 25C, for example, of silicon nitride.

The upper connection region 26 is formed by a conductive layer, for example, of aluminum, AlCu, copper or gold, which extends over at least part of the second insulating layer 25B and forms a protrusion extending through the first and the second insulating layers 25A, 25B and in direct electrical contact with the upper electrode 22. The upper connection region 26 allows the electrical connection of the upper electrode 22 with contact pads, not shown here, for its biasing. A lower connection region, not shown, similar to the upper connection region 26, allows the lower electrode 21 to be biased to a suitable potential, for example, to ground.

The third insulating layer 25C extends above the second insulating layer 25B and the upper connection region 26.

The passivation region 25 allows the actuator 10 to be electrically isolated and protected from external contaminants.

In use, the application of a bias voltage between the lower electrode 21 and the upper electrode 22 causes a deformation of the piezoelectric region 20 and consequently of the deformable structure 16, integral therewith.

In some applications, it is important to monitor or control the extent of the deformation of the deformable structure 16, so to detect changes thereof or to verify that the deformation complies with what desired. In particular, in order to control the deformation, a closed loop control system is frequently provided which allows the deformation of the deformable structure 16 to be controlled in real time.

Therefore, the actuator 10 may be provided with deformation sensors of the deformable structure 16, for example, made using piezoelectric structures formed by the same layer which forms the piezoelectric region 20 or using piezoresistive structures. However, these solutions are not optimal.

In fact, the PZT is a ferroelectric material characterized by hysteresis and by a high relative electrical permittivity. As a result, it generates low detection voltages in presence of a mechanical stress, thus making the stress measurement noisy and inaccurate.

Piezoresistors are devices which, in the presence of mechanical stress, undergo a variation in electrical resistance and therefore allow the deformation of the deformable structure to be detected by means of a voltage or current detection. However, this detection is an active detection and thus implies a passage of current with consequent high energy consumption.

BRIEF SUMMARY

The present disclosure is directed to a micro-electromechanical structure (MEMS) actuator that has a substrate surrounding a cavity. The MEMS includes a deformable structure suspended on the cavity. An actuation structure includes a first piezoelectric region of a first piezoelectric material, supported by the deformable structure and configured to cause a deformation of the deformable structure. A detection structure includes a second piezoelectric region of a second piezoelectric material, supported by the deformable structure and configured to detect the deformation of the deformable structure.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein:

FIGS. 2-5A show cross-sections of the present piezoelectric MEMS actuator in successive fabrication steps;

FIG. 11 shows a cross-section of an embodiment of an actuation system incorporating the present piezoelectric MEMS actuator;

FIG. 12 shows a cross-section of an actuation system incorporating the present piezoelectric MEMS actuator according to a further embodiment;

FIG. 13 shows a perspective view of a different embodiment of the present piezoelectric MEMS actuator;

FIG. 14 shows a cross-section of the piezoelectric MEMS actuator of FIG. 13, taken along section line XIV-XIV of FIG. 13;

FIG. 15 shows a cross-section of the piezoelectric MEMS actuator of FIG. 13, taken along section line XV-XV of FIG. 13;

FIG. 16 shows a top plan view of a different embodiment of the present piezoelectric MEMS actuator;

DETAILED DESCRIPTION

Figure 1:
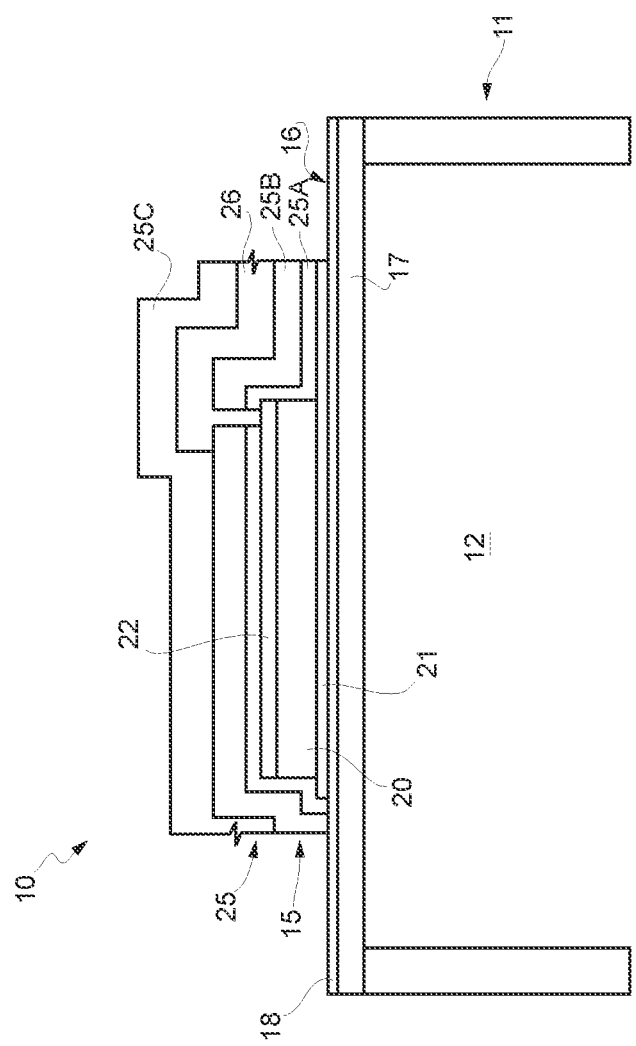
FIG. 1 is a cross-section of a known piezoelectric MEMS actuator.

FIG. 2 shows a cross section of a wafer 45, which has already undergone first processing steps. In detail, the wafer 45 comprises a substrate 50 of semiconductor material, for example, silicon, having a first and a second surface 50A, 50B. A first shaping layer 51, for example, of deposited tetraethyl orthosilicate (TEOS), extends on the first surface 50A of the substrate 50, having, for example, a thickness of at least 1 µm, here of 1 µm.

Subsequently, FIG. 3, the first shaping layer 51 is patterned through a selective etching, in a manner known to the person skilled in the art, so as to form a lower shaping region 52, usable for the successive formation of a constriction structure, as described hereinafter in detail.

Furthermore, a stiffening layer 53 of semiconductor material, for example, polysilicon, is formed, for example, epitaxially grown, on the first surface 50A of the substrate 50 and on the lower shaping region 52; the stiffening layer 53 is then subjected to chemical-mechanical polishing, so as to form a flat upper surface. The stiffening layer 53 has a greater thickness than the first shaping layer 51, in this embodiment of 25 µm.

Subsequently, a first insulating layer 54, for example, of tetraethyl orthosilicate (TEOS) and having here a thickness comparable with that of the first shaping layer 51, such as at least 1 µm and here of 1 µm, is deposited on the stiffening layer 53.

In FIG. 4, a structural layer 55, of semiconductor material such as polysilicon, is deposited on the first insulating layer 54. The structural layer 55 has a thickness chosen on the basis of desired mechanical characteristics, for example, in this embodiment, it has a thickness of 10 µm and may be in the range of 8 µm and 18 µm.

A second insulating layer 56, for example, of tetraethyl orthosilicate (TEOS) and having here a thickness of 0.5 µm, is deposited on the structural layer 55. The second insulating layer 56 is thinner than the structural layer 55.

Figure 5B:
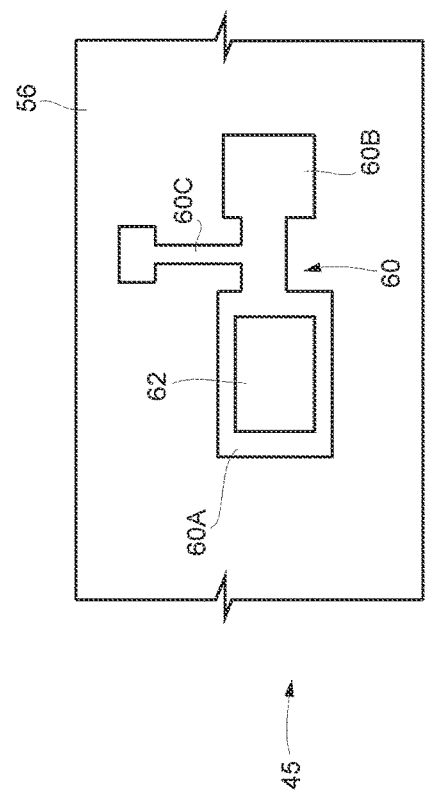
FIG. 5B shows a top view of the present piezoelectric MEMS actuator in the fabrication step of FIG. 5A.
Figure 5A:
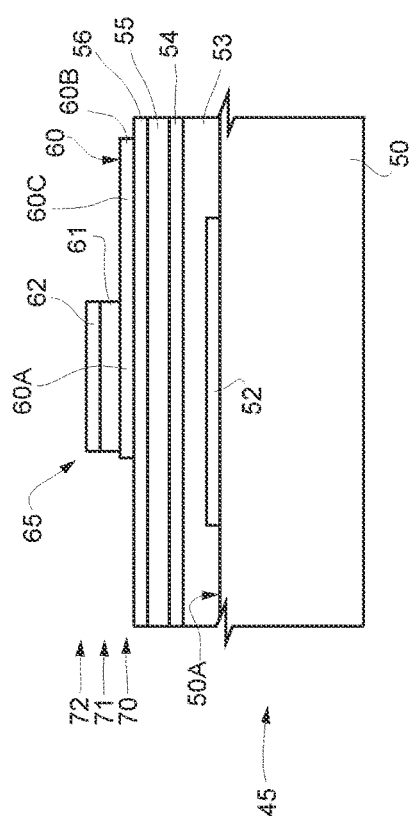

Then, FIG. 5A, a first conductive layer 70, for example, of platinum, is deposited on the second insulating layer 56; an actuation layer 71 of unimorph or bimorph piezoelectric material having a high relative electrical permittivity, for example, greater than 100, such as lead zirconate titanate (PZT), $BaTiO_3$, KNN (sodium potassium niobate), $PbTiO_2$ or $PbNb_2O_6$ and having a thickness in the range 1 µm and 3 µm, in particular of 2 µm, is deposited on the first conductive layer 70; a second conductive layer 72, for example, of a tungsten-titanium alloy, of platinum, yttrium or iridium oxide, is deposited on the actuation layer 71, forming a stack of layers.

Alternatively, the actuation layer 71 may be formed of ceramic piezoelectric material.

The stack of layers thus obtained is patterned by lithographic and selective etching steps known to the person skilled in the art, so that the first conductive layer 70 forms a lower electrode region 60, the actuation layer 71 forms a piezoelectric actuation region 61 and the second conductive layer 72 forms an upper electrode region 62.

In particular, as visible in the top planar view of FIG. 5B, the upper electrode region 62 and the underlying piezoelectric actuation region 61 (not visible in FIG. 5B) are patterned in a first etching step and thus have the same shape; the lower electrode region 60 is patterned in a separate etching step, for example, after patterning the upper electrode 62 and piezoelectric actuation region 61, and comprises an actuation portion 60A, a detection portion 60B and a connection portion 60C. In detail, the actuation portion 60A approximately underlies the upper electrode 62 and the piezoelectric actuation region 61; the detection portion 60B and the connection portion 60C extend laterally to the upper electrode 62 and to the piezoelectric actuation region 61.

The actuation portion 60A of the lower electrode region 60, the piezoelectric actuation region 61 and the upper electrode region 62 form an active actuation structure 65.

Subsequently, FIG. 6, a piezoelectric layer 73, for example, of aluminum nitride (AlN) and having a thickness in the range 0.5 and 3 µm, in particular of 1 µm, is deposited on the first surface 50A of the substrate 50 and is patterned, through lithography and selective etching, so as to form a piezoelectric detection region 80 and a passivation region 81.

The passivation region 81 surrounds the active actuation structure 65 and extends on a portion of the second insulating layer 56 at least on a first side of the active actuation structure 65 (on the left in FIG. 6) and forms a first opening 82 above the upper electrode region 62.

Figure 6:
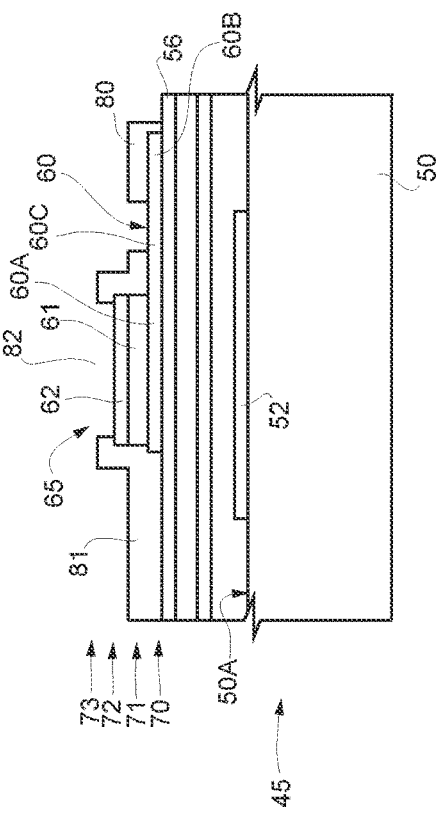
FIGS. 6-10 show cross-sections of the present piezoelectric MEMS actuator in successive fabrication steps.

The piezoelectric detection region 80 extends on the detection portion 60B, at a distance from the passivation region 81, here on a second side of the active actuation structure 65 (on the right in FIG. 6).

Figure 7:
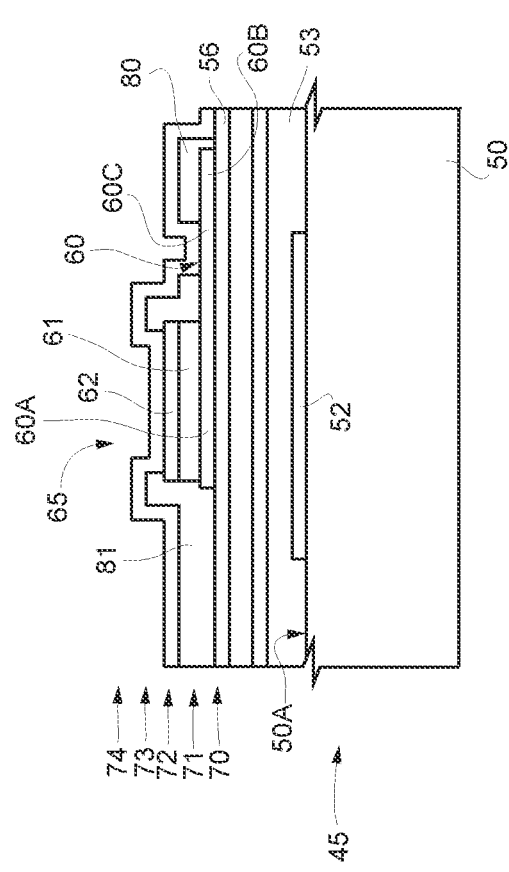

In FIG. 7, a third conductive layer 74, for example, of molybdenum, platinum, yttrium or iridium oxide, is deposited from above the wafer 45.

Figure 8:
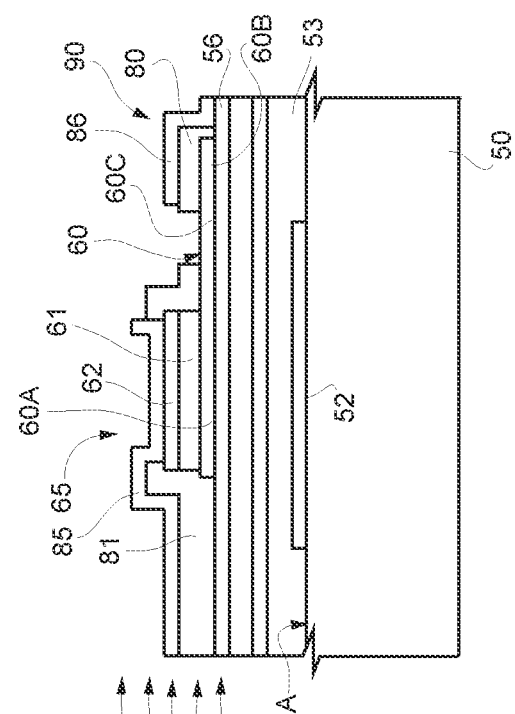

Subsequently, FIG. 8, the third conductive layer 74 is patterned, in a manner known to the person skilled in the art, so as to form a conductive connection region 85 and an upper detection electrode region 86.

The conductive connection region 85 extends over the active actuation structure 65, in contact with the upper electrode region 62, and over the passivation region 81 and connects the upper electrode region 62 to contact pads, not shown here.

The upper detection electrode region 86 extends on the piezoelectric detection region 80 and the second insulating layer 56 on the second side of the active actuation structure 65.

The detection portion 60B of the lower electrode region 60, the piezoelectric detection region 80 and the upper detection electrode region 86 form a detection structure 90.

Figure 9:
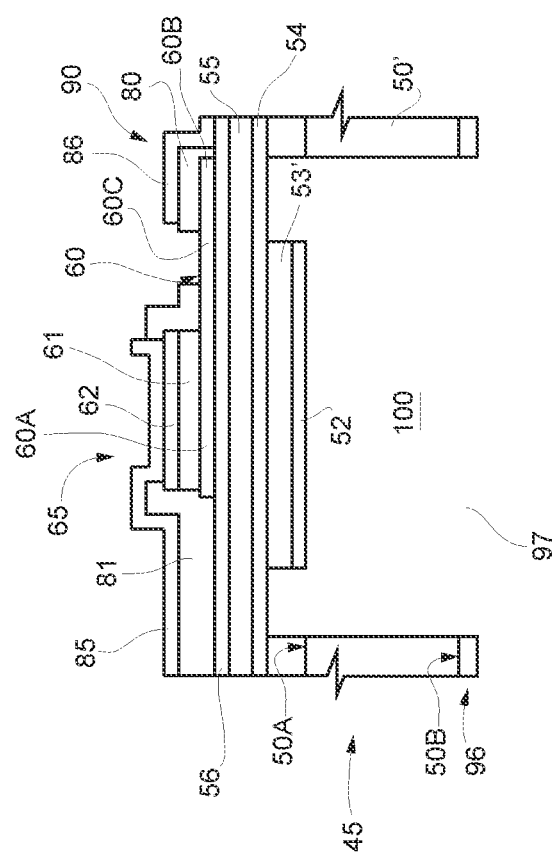

In FIG. 9, a second shaping layer 96 is deposited on the second surface 50B of the substrate 50 and patterned lithographically so as to form a window 97 on the back side of the wafer 45, below the active actuation structure 65 and the detection structure 90, as discussed hereinafter.

A selective etching, for example, a dry chemical etching, is then performed starting from the second surface 50B of the substrate 50, removing the semiconductor material thereof at the window 97 and at a portion of the stiffening layer 53 not covered by the lower shaping region 52 and forming a cavity 100. Thus, a bearing portion 50' remains from the substrate 50 and a portion underlying the active actuation structure 65, indicated with 53', remains from the stiffening layer 53.

Figure 10:
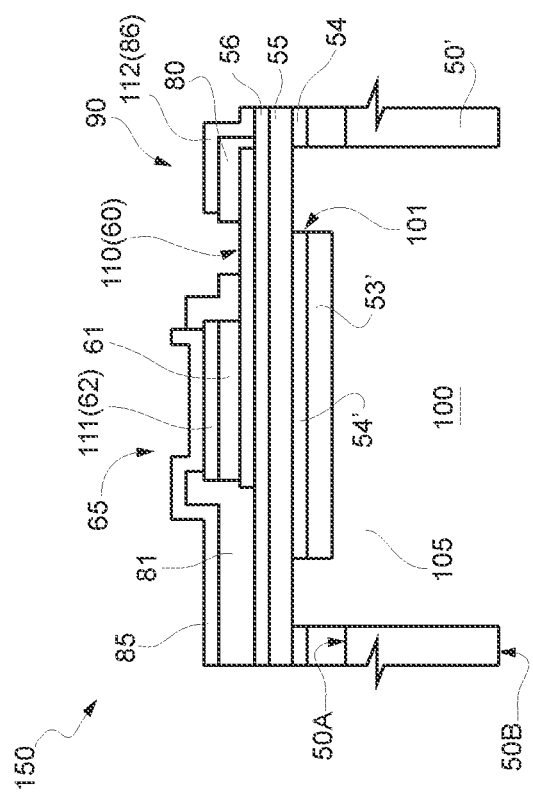

In FIG. 10, using again the second shaping layer 96 as an etching mask, the lower shaping region 52 and portions of the first insulating layer 54, on the sides of the portion 53' of the stiffening layer 53, are removed.

The portion 53' of the stiffening layer 53 and the remaining portion (indicated with 54') of the first insulating layer 54 form a constriction structure 101; the structural layer 55 and the second insulating layer 56, now suspended on the cavity 100, form a deformable structure 105.

In practice, here, the deformable structure 105 is a suspended membrane.

Finally, the second shaping layer 96 is removed, the wafer 45 is diced and each die, after usual electrical connection and packaging steps, forms a piezoelectric MEMS actuator 150.

The piezoelectric MEMS actuator 150 thus obtained comprises a lower electrode 110 (including the actuation portion 60A, the detection portion 60B and the connection portion 60C of the lower electrode region 60 of FIG. 5B), an upper actuation electrode 111 (corresponding to the upper electrode region 62) and an upper detection electrode 112 (corresponding to the upper detection electrode region 86).

In use, a bias voltage applied between the upper actuation electrode 111 and the lower electrode 110 causes a deformation of the active actuation structure 65, in a known manner. As a result, the deformable structure 105, integral with the active actuation structure 65 and suspended on the cavity 100, deforms. The deformation of the deformable structure 105 generates a mechanical stress in the detection structure 90 which is arranged in a peripheral portion of the deformable structure 105, adjacent to the bearing portion 50', which represents a constraint region for the deformable structure 105.

In this manner, in presence of the mechanical stress, the piezoelectric detection region 80 generates a detection voltage between the lower electrode 110 and the upper detection electrode 112, which may be measured and converted into a deformation value of the deformable structure 105, in a known manner. Thus, the measurement of the detection voltage allows the state of the piezoelectric MEMS actuator 150 to be controlled, through a closed loop control system and in real time.

The measurement of the detection voltage is a passive detection, i.e., it does not need a passage of current, and is thus favorable from the power point of view.

In order to obtain a good detection sensitivity, it is desirable that the piezoelectric detection region 80 has a linear, non-hysteretic behavior, and that the ratio between detection voltage and mechanical stress is high.

As a result, piezoelectric materials with a low relative electrical permittivity, for example, approximately lower than or equal to 10, and a loss tangent, for example, lower than 0.05, in particular equal to 0.002, are preferred.

Alternatively, the piezoelectric materials which form the piezoelectric detection region 80 may be ceramic materials.

The piezoelectric detection region 80 is formed here of aluminum nitride (AlN), which has a linear and high-ratio dependency of detection voltage/mechanical stress. However, other materials may be used, such as zinc oxide and polyvinylidene fluoride (PVDF).

Furthermore, the passivation region 81 is also formed of aluminum nitride. In fact, this material has excellent electrical insulation properties and is chemically stable up to high temperatures (even up to 1077° C.) even in an oxidizing environment such as air and humidity. As a result, forming the passivation region 81 allows the piezoelectric MEMS actuator 150 to be passivated by depositing and patterning a single layer of material, thus reducing the fabrication steps and costs of the piezoelectric MEMS actuator 150 itself.

The piezoelectric MEMS actuator 150 may be used in apparatuses for, for example, the automatic focusing of cameras, picoprojectors and microfluidic valves.

FIG. 11 shows, for example, the use of the piezoelectric MEMS actuator 150 inside a microfluidic valve 300.

In detail, the microfluidic valve 300 comprises a body 290 and the piezoelectric MEMS actuator 150 bonded to the body 290. The microfluidic valve 300 accommodates a fluidic channel 310 having an inlet port IN and an outlet port OUT.

In detail, the body 290 comprises a first and a second channel body 301, 302, typically of semiconductor material, for example, silicon, processed and reciprocally bonded in a manner not visible in FIG. 11.

For example, the first channel body 301 has a generally parallelepiped shape having a first and a second surface 301A, 301B. The first channel body 301 accommodates a horizontal channel portion 309 extending along the second surface 301B of the first channel body 301 and closed at the bottom by the second channel body 302.

A through opening 303 extends through the first channel body 301, between the first surface 301A and the horizontal channel portion 309.

The second channel body 302 has, in this embodiment, a generally parallelepiped shape having an upper surface 302A bonded to the second surface 301B of the first channel body 301. The second channel body 302 has a protrusion 305 extending from the upper surface 302A of the second channel body 302 inside the through opening 303 of the first channel body 301.

The bearing portion 50' of the piezoelectric MEMS actuator 150 is bonded here to the first surface 301A of the first channel body 301, so that the constriction structure 101 faces, at a distance, one end of the protrusion 305 and delimits therewith a passage 315 of the fluidic channel 310. In practice, the protrusion 305 and the constriction structure 101 form a constriction portion 312 of the microfluidic valve 300.

Thus, the passage 315, the through opening 303 and the horizontal channel portion 309 form the fluidic channel 310.

In addition, the microfluidic valve 300 comprises a control unit 320 coupled to the piezoelectric MEMS actuator 150, in particular to the active actuation structure 65 and to the detection structure 90, through contact pads not shown here, for the exchange of the signals and the electrical quantities used to control the microfluidic valve 300 itself.

To this end, the control unit 320 comprises input/output ports 321, 322 for receiving control signals and sending detection signals to the outside (for example, towards a user), a control stage 323 (for example, a CPU) for processing the signals provided for the control, and a driving stage 324, for controlling the piezoelectric MEMS actuator 150. The control stage 323 may, for example, store conversion tables between nominal flow (desired) and value of actuation bias voltage to be provided to the piezoelectric MEMS actuator 150.

In use, a user may set, through the input ports 321, a nominal flow value of a fluid inside the fluidic channel 310. Based on the stored tables, the control unit 320 applies a bias voltage of suitable value to the active actuation structure 65, causing the deformation thereof. The deformable structure 105 then deforms, moving, based on the value of the bias voltage, the constriction structure 101 closer to the end of the protrusion 305 of the second channel body 302, so as to set the section of the passage 315 of the fluidic channel 310 and hence the flow.

Simultaneously, and as explained hereinabove, the mechanical stress caused by the deformation of the deformable structure 105 generates, in the detection structure 90, a detection voltage which is provided to the control unit 320.

The control unit 320 compares the value of the detection voltage, or quantities related thereto, with appropriate calibration parameters corresponding to a flow value and verifies, in real time, that the fluid flow complies with the nominal value. If not, the control unit 320 may modify the bias voltage applied to the active actuation structure 65 so as to make the flow compliant with the nominal value.

FIG. 12 shows another embodiment of the present piezoelectric MEMS actuator, hereinafter indicated with the reference number 350, used inside a microfluidic valve, here indicated with 400. The piezoelectric MEMS actuator 350 and the microfluidic valve 400 have similar general structure and functioning to the piezoelectric MEMS actuator 150 and to the microfluidic valve 300, respectively; thus elements in common are indicated with the same reference numbers.

In particular, here, the fluidic channel 310 and the piezoelectric MEMS actuator 350 are formed inside a body 390, of semiconductor material, for example, silicon.

In detail, also here, the active actuation structure 65 and the detection structure 90 are arranged on the deformable structure 105.

Here, the deformable structure 105 is suspended on a cavity 410 and both the deformable structure 105 and the cavity 410 are formed by the body 390. In practice, here, a through opening is no longer present and the protrusion 305 extends inside the cavity 410. Thus, here, the constriction portion 312 is delimited by the protrusion 305 and the deformable structure 105, which also forms the constriction structure of the piezoelectric MEMS actuator 350.

Another embodiment of the present piezoelectric MEMS actuator is described hereinbelow with reference to FIGS. 13-15.

In detail, FIGS. 13-15 show a piezoelectric MEMS actuator 500 that is formed in a die 505 comprising a bearing portion 510, which surrounds a cavity 515, and a deformable structure 520, which is fixed to the bearing portion 510 and suspended on the cavity 515. Here, the piezoelectric MEMS actuator 500 has a cylindrical symmetry; therefore, for clarity, only a quarter of the piezoelectric MEMS actuator 500 is shown in FIG. 13.

The die 505 has a first and a second surface 505A, 505B and is formed by a multilayer structure 523. Here, the multilayer structure 523 includes a substrate 525 of semiconductor material downwardly delimited by the second surface 505B of the die 505; a first insulating layer 528, e.g., of oxide; a structural layer 530, of semiconductor material, overlying the first insulating layer 528; and a second insulating layer 533, e.g., of oxide, overlying the structural layer 530 and upwardly delimited by the first surface 505A of the die 505.

The substrate 525 and the first insulating layer 528 have a cylindrical shape, surround the cavity 515 and form the bearing portion 510.

The structural layer 530 has a thickness, for example, comprised between 3 μm and 150 μm and has a first portion 530A extending on the first insulating layer 528 and a second portion 530B extending over the cavity 515.

The cavity 515, here of cylindrical shape, has a diameter, for example, comprised between 20 μm and 3000 μm and extends from the second surface 505B of the die 505 through the die 505 up to the second portion 530B of the structural layer 530.

The structural layer 530 and the second insulating layer 533 form the deformable structure 520, which has a movable portion 520A that delimits the cavity 515 at the top, and is therefore suspended thereon, and a fixed portion 520B overlying the first insulating layer 528, therefore fixed to the bearing portion 510.

The deformable structure 520 is much thinner than the bearing portion 510 and has a thickness which is much smaller than the diameter of the cavity 515; therefore the deformable structure 520 is a suspended membrane.

The MEMS piezoelectric actuator 500 further comprises an actuation structure 535 (corresponding to the active actuation structure 65 of the piezoelectric MEMS actuator 150) and a detection structure 536, which are supported by the deformable structure 520, in particular by the movable portion 520A.

The actuation structure 535 is arranged on the second insulating layer 533 at the center of the movable portion 520A of the deformable structure 520 and has here a cylindrical shape having a diameter smaller than the diameter of the cavity 515, for example, about 70% of the diameter of the cavity 515.

The actuation structure 535 is formed by a respective stack comprising a lower actuation electrode 537 of conductive material, for example, platinum, extending on the second insulating layer 533; a piezoelectric actuation region 539 of unimorph or bimorph piezoelectric material having a high relative electrical permittivity, for example, greater than 100, such as lead zirconate titanate (PZT), $BaTiO_3$, KNN (sodium potassium niobate), $PbTiO_2$ or $PbNb_2O_6$, having a thickness in the range 1-5 μm, in particular of 2 μm, and extending on the lower actuation electrode 537; and an upper actuation electrode 541 of conductive material extending on the piezoelectric actuation region 539. Here, the upper actuation electrode is formed by a first conductive layer 541A, for example, of a tungsten-titanium alloy, of platinum, yttrium or iridium oxide and a second conductive layer 541B, for example, of molybdenum, of a tungsten-titanium alloy, of platinum, yttrium or iridium oxide.

The detection structure 536 extends on the second insulating layer 533 at the edge of the movable portion 520A of the deformable structure 520, near the fixed portion 520B.

The detection structure 536 comprises here a plurality of detection units 543, arranged in succession and apart from one another along a peripheral circumference of the movable portion 520A of the deformable structure 520.

Each detection unit 543 is here a curved strip and is formed by a respective stack comprising a lower detection electrode 545 of conductive material; a piezoelectric detection region 547; and an upper detection electrode 549 of conductive material. The lower detection electrode 545 is, for example, of platinum, and extends on the second insulating layer 533; the piezoelectric detection region 547 is of a piezoelectric material having a low relative electrical permittivity, for example, lower than or equal to 10, a loss tangent, for example, lower than 0.05, in particular equal to 0.002, and a thickness in the range 0.5-3 µm, in particular of 1 µm, and extends on the lower detection electrode 545 and on the second insulating layer 533, on a side of the lower detection electrode 545. The upper detection electrode 549 is, for example, of molybdenum, of a tungsten-titanium alloy, of platinum, yttrium or iridium oxide, and covers the piezoelectric detection region 547.

Similarly to the piezoelectric MEMS actuator 150, 350, the piezoelectric detection region 547 is here of aluminum nitride (AlN), which has a linear and non-hysteretic behavior, and has a high detection voltage/mechanical stress ratio.

However, the piezoelectric detection region 547 may be of a different piezoelectric material, for example, zinc oxide, polyvinylidene fluoride (PVDF) or a ceramic piezoelectric material.

Here, as visible in FIG. 15, the detection units 543 are configured so that the upper detection electrode 549 of each detection unit 543 is in direct electrical contact with the lower detection electrode 545 of an adjacent detection unit 543. In other words, the detection units 543 are electrically connected in series to one another.

The piezoelectric MEMS actuator 500 comprises also a passivation region 550 (FIG. 14) that circumferentially surrounds the detection structure 535. Similarly to the passivation region 81 of the piezoelectric MEMS actuator 150, 350, the passivation region 550 is here formed by the same piezoelectric material that forms the piezoelectric detection region 547, thus bringing the same advantages already described for the piezoelectric MEMS actuator 150, 350.

The piezoelectric MEMS actuator 500 further comprises metal tracks, here not shown, which allow the connection of the actuation structure 535 to a driving circuit, for the biasing thereof, and the connection of the detection structure 536 to a sensing circuit.

The driving circuit and the sensing circuit may be either integrated in the die 505 or in one or more separate dies and may comprise one or more control units.

The lower detection electrode 545 of a first detection unit of the succession of detection units 543, here not shown, is connected to a reference voltage, for example, to ground, and the upper detection electrode 549 of a last detection unit of the succession of detection units 543, also not shown, is connected to a voltage readout device.

It follows that the piezoelectric MEMS actuator 500 may be used as a piezoelectric micromachined ultrasonic transducer (PMUT) to obtain, for example, a time-of-flight measuring device, for example, to measure a distance between the deformable structure 520 and an object or obstacle placed near the piezoelectric MEMS actuator 500.

In use, the driving circuit applies a bias voltage between the upper actuation electrode 541 and the lower actuation electrode 537 in order to cause a deformation, in a per se know manner, of the piezoelectric actuation region 539 and the movable portion 520A of the deformable structure 520, integral therewith. In particular, the bias voltage may have a high frequency, for example, equal to the resonance frequency of the deformable structure 520, for example, higher than 20 kHz.

Similarly to what described hereinabove with respect to the piezoelectric actuator 150, 350, the deformation of the deformable structure 520 generates a mechanical stress in the detection structure 536. The detection structure 536, as said, is arranged in a peripheral portion of the movable portion 520A of the deformable structure 520, adjacent to the fixed portion 520B thereof, which is integral with the bearing portion 510 and therefore represents a constraint region for the deformable structure 520.

In presence of the mechanical stress, the piezoelectric detection region 547 generates a detection voltage between the lower detection electrode 545 and the upper detection electrode 549, which may be sensed and measured by the sensing circuit, in a known manner.

Moreover, the deformation of the deformable structure 520 also generates a pressure wave, which propagates from the deformable structure 520 through the medium, for example, air, water, or other fluids, that surrounds the piezoelectric MEMS actuator 500.

If the pressure wave hits an obstacle, part of the pressure wave bounces back and reaches the piezoelectric MEMS actuator 500 again. The part of the pressure wave that impinges on the movable portion 520A of the deformable structure 520 modifies the extent of the deformation of the deformable structure 520. Thus, the mechanical stress and, as a consequence, also the detection voltage, change.

The change of the detection voltage may be used by the sensing circuit. For example, the sensing circuit may be configured to measure a time interval between the generation of the pressure wave and the detection of the portion of pressure wave that bounces back and impinges on the piezoelectric MEMS actuator 500. The time interval may be converted, for example, using calibration parameters stored in a memory, to calculate a distance between the deformable structure 520 and the obstacle.

The detection structure 536 of the piezoelectric MEMS actuator 500, similar to what described for the detection structure 90 of the piezoelectric MEMS actuator 150, may generate a high detection voltage; therefore the piezoelectric MEMS actuator 500 may have a high sensitivity in monitoring the deformation of the deformable structure 520.

Moreover, the series connection of the detection units 543 allows the detection voltage to have a high value, thus allowing to further increase the sensitivity of the piezoelectric MEMS actuator 500 in monitoring the deformation of the deformable structure 520.

The piezoelectric MEMS actuator 500 of FIGS. 13-15 may be obtained by fabrication steps similar to the ones described with reference to FIGS. 2-10 for manufacturing the piezoelectric MEMS actuator 150 and thus not further described.

FIG. 16 shows a different embodiment of the present piezoelectric MEMS actuator, here indicated by 600, which has a general structure and a functioning similar to the piezoelectric MEMS actuator 500; therefore elements in common are designated with the same reference numbers.

In detail, also the piezoelectric MEMS actuator 600 is formed in the die 505, which has here a rectangular shape in top plan view. Also here, the die 505 comprises the bearing portion 510, which surrounds the cavity 515 (here not visible), and the deformable structure 520.

Moreover, the piezoelectric MEMS actuator 600 comprises the actuation structure 535 and the detection structure 536. In this embodiment, the detection structure 536 comprises, in addition to the plurality of detection units 543, a plurality of test detection structures 605.

The test detection structures 605 are each formed by a respective stack, here not shown, which is similar to the stack that forms the detection units 536 and extend on the actuation structure 535.

In detail, here, the test detection structures 605 have each a circular shape, in top plan view, and are concentric to each other and may be connected in series, in a manner similar to the detection units 543, or may be electrically separated from one another.

The test detection structures 605 are also connected to a sensing circuit (not shown).

Since the test detection structures 605 are arranged on the actuation structure 535—and therefore are integral therewith—the test detection structures 605 are able to directly detect the deformation of the actuation structure 535, in particular of the actuation piezoelectric region 539.

Therefore, the test detection structures 605 may be used to verify that the actuation structure 535 is correctly biased and actuated by the driving circuit. For example, the test detection structures 605 may be used as a diagnostic tool to verify the correct functioning of the piezoelectric MEMS actuator 600, thereby increasing its reliability.

Figure 17:
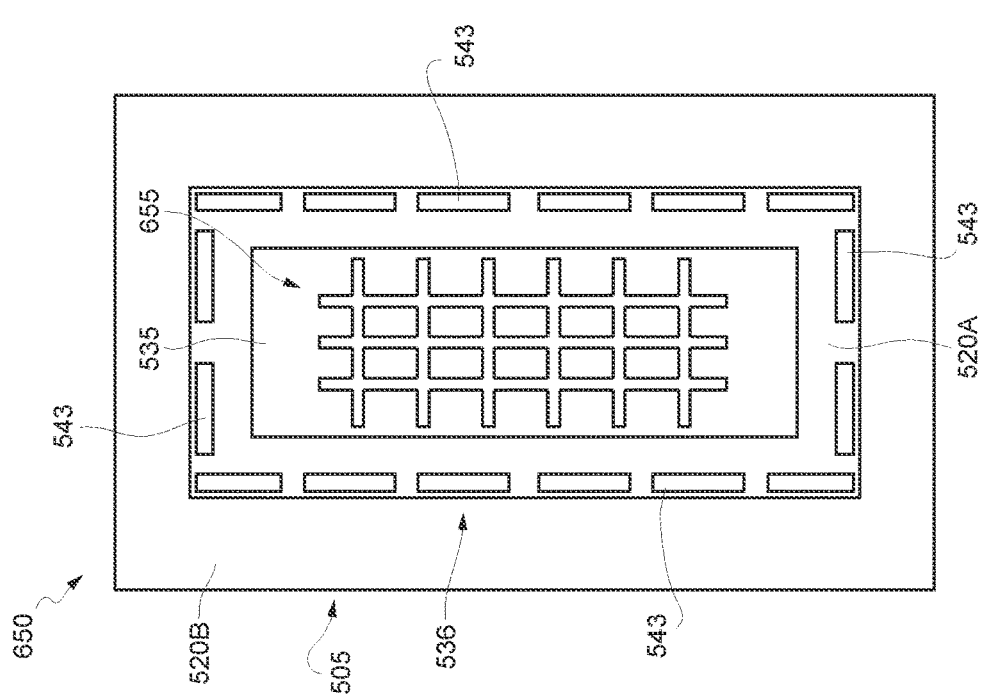
FIG. 17 shows a top plan view of a different embodiment of the present piezoelectric MEMS actuator.

FIG. 17 shows a different embodiment of the present piezoelectric MEMS actuator, here indicated by 650. The piezoelectric MEMS actuator 650 is similar to the piezoelectric MEMS actuator 600 of FIG. 16, wherein the test detection structure, here indicated by 655, is grid-shaped.

Figure 18:
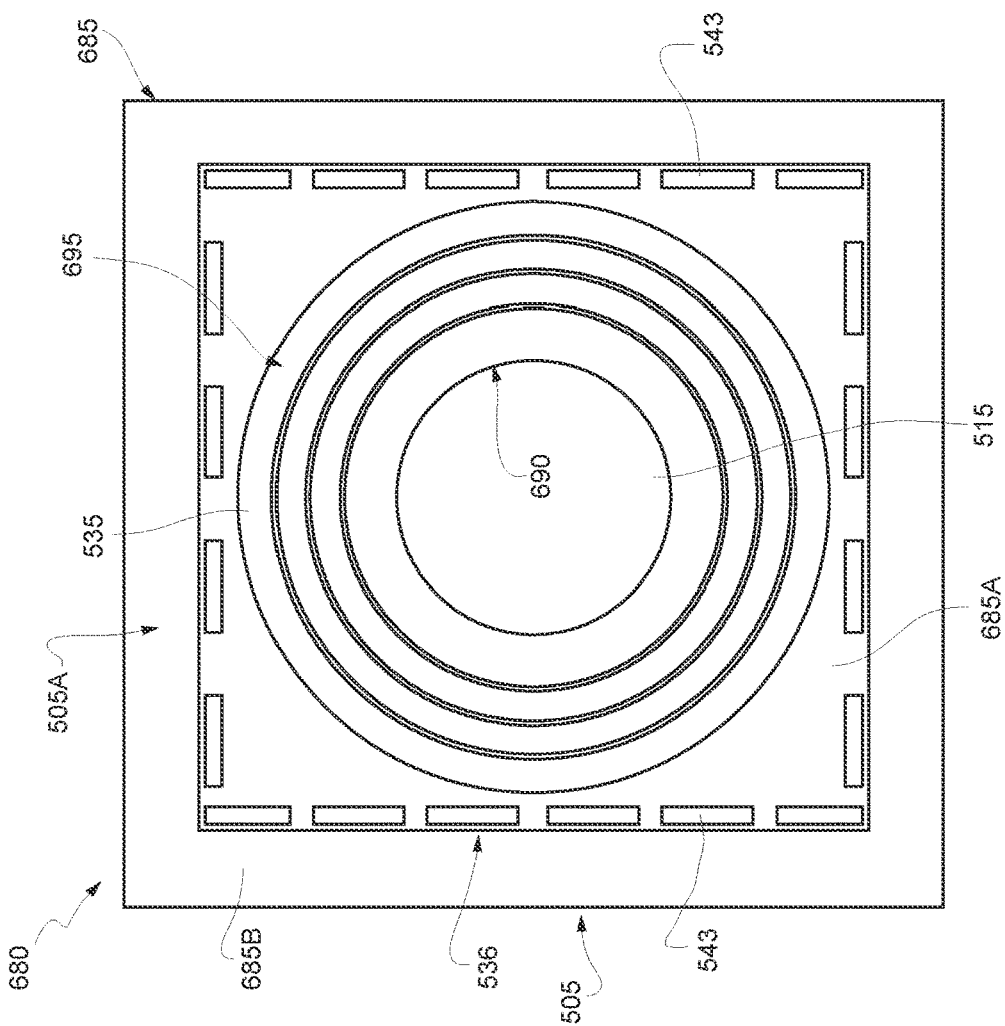
FIG. 18 shows a top plan view of a different embodiment of the present piezoelectric MEMS actuator.

FIG. 18 shows a different embodiment of the present piezoelectric MEMS actuator, here indicated by 680. The piezoelectric MEMS actuator 680 has a general structure similar to the piezoelectric MEMS actuators 600, 650; therefore, elements in common are designated with the same reference numbers.

In detail, the die 505 has here a rectangular shape in top plan view and comprises a deformable structure 685, which has a movable portion 685A and a fixed portion 685B.

Here, a pass-through cavity 690 extends from the cavity 515, in communication therewith, through a central portion of the movable portion 685A of the deformable structure 685, up to the first surface 505A of the die 505.

The actuation structure 535 of the piezoelectric MEMS actuator 680 extends on the movable portion 685A of the deformable structure 685, around the central portion thereof.

The detection structure 536 is formed by the plurality of detection units 543 and by test detection structures 695. In this embodiment, the test detection structures 695 have each a circular shape and extends on the actuation structure 535 around the pass-through cavity 690. The test detection structures 695 may be connected in series, similarly to the detection structures 605 of the piezoelectric MEMS actuator 600, or may be electrically separated one from another.

The piezoelectric MEMS actuator 680 may be used as a PMUT, similarly to what described hereinabove. The piezoelectric MEMS actuator 680 may be useful in specific applications wherein fluidic communication between an upper side and a lower side of the deformable structure 685 is desired.

Figure 19:
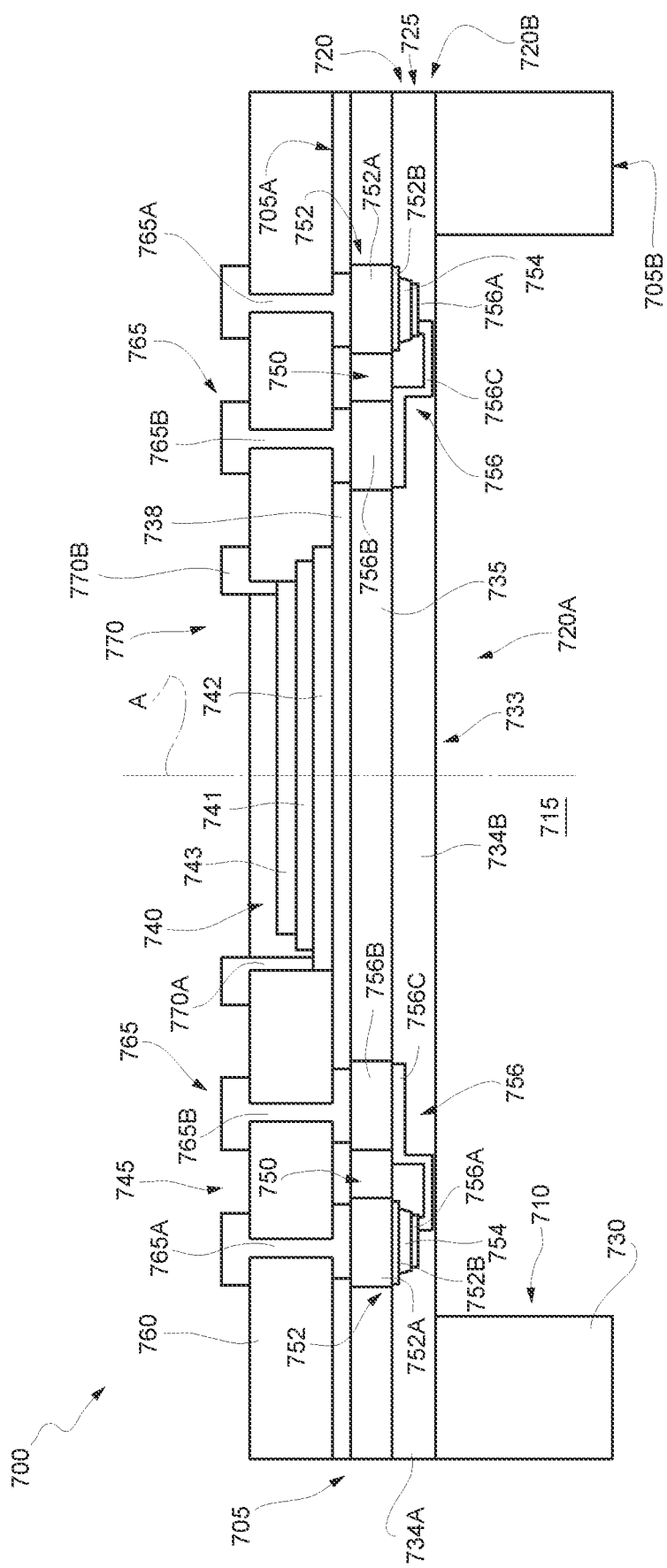
FIG. 19 shows a cross-section of a different embodiment of the present piezoelectric MEMS actuator.

FIG. 19 shows a different embodiment of the present piezoelectric MEMS actuator, here indicated by 700. The piezoelectric MEMS actuator 700 has a general structure similar to the piezoelectric MEMS actuator 500; therefore, elements in common are designated with the same reference numbers.

In detail, also the piezoelectric MEMS actuator 700 has a cylindrical symmetry, around an axis A, and is formed in a die 705 having a first and a second surface 705A, 705B, and comprising a bearing portion 710, which surrounds a cavity 715, and a deformable structure 720, which has a movable portion 720A suspended on the cavity 715 and a fixed portion 720B fixed to the bearing portion 710.

The die 705 is formed by a multilayer structure 725, which includes a substrate 730 of semiconductor material, a first insulating layer 733, for example, of oxide, a structural layer 735 of semiconductor material, and a second insulating layer 738, for example, of oxide.

The substrate 730 is a hollow cylinder and is delimited downwardly by the second surface 705B of the die 705 and upwardly by a first upper surface 705A.

The first insulating layer 733 has a thickness, for example, comprised between 3 µm and 4 µm and comprises a first portion 734A extending on the substrate 730, and a second portion 734B extending over the cavity 715.

The structural layer 735 has a thickness, for example, comprised between 5 µm and 40 µm and extends on the first insulating layer 733.

The second insulating layer 738 extends on the structural layer 735 and is upwardly delimited by the first surface 705A of the die 705.

The cavity 715, also here of cylindrical shape, extends from the second surface 705B of the die 705 up to the first insulating layer 733. Thus, the substrate 730 delimits laterally the cavity 715, forming the bearing portion 710.

The first insulating layer 733, the structural layer 735 and the second insulating layer 738 form the deformable structure 720.

The MEMS piezoelectric actuator 700 further comprises an actuation structure 740 and a detection structure 745, which are supported by the deformable structure 720, in particular by the movable portion 720A.

Similarly to the actuation structure 535 of the piezoelectric MEMS actuator 500, the actuation structure 740 extends on the second insulating layer 738, at the center of the movable portion 720A of the deformable structure 720, and is formed by a piezoelectric actuation region 741 sandwiched between a lower actuation electrode 742 and an upper actuation electrode 743.

The detection structure 745 comprises a plurality of detection units 750, each of which extends in succession at the edge of the movable portion 720A of the deformable structure 720, near the fixed portion 720B (similarly to the detection units 536 of FIG. 13), but is here buried in the deformable structure 720.

In detail, each detection unit 750 is formed by a lower detection electrode 752, a piezoelectric detection region 754 and an upper detection electrode 756.

The lower detection electrode 752 comprises a first doped region 752A, which extends throughout the thickness of the structural layer 735, and a first metallic region 752B, for example, of molybdenum, which extends in the first insulating layer 733, in direct electrical contact with the first doped region 752A.

The piezoelectric detection region 754 is formed by the same piezoelectric material forming the piezoelectric detection region 547 of the piezoelectric MEMS actuator 500, for example, of aluminum nitride, and extends in the first insulating layer 733 on the first metallic region 752B.

The upper detection electrode 756 is formed by a second metallic region 756A, for example, of molybdenum, extending in the first insulating layer 733 on the piezoelectric detection region 754; a second doped region 756B, which extends throughout the thickness of the structural layer 735; and a conducting via 756C, of conductive material, extending in the first insulating layer 733 between and in direct electrical contact with the second doped region 756B and the second metallic region 756A.

The piezoelectric MEMS actuator 700 has a passivation region 760, for example, of 3 µm, which extends on the second insulating layer 738 and surrounds the actuation structure 740.

The piezoelectric MEMS actuator 700 further comprises detection vias 765 and actuation vias 770, of conductive material. The detection vias 765 extend through the passivation region 760 and the second insulating layer 738 to the structural layer 735 and comprise a first detection-electrode via 765A, in direct electrical contact with the first doped region 752A of a respective detection unit 750, and a second detection-electrode via 765B, in direct electrical contact with the second doped region 756B of a respective detection unit 750.

The actuation vias 770 extend through the passivation region 760 and comprise a first actuation-electrode via 770A, in direct electrical contact with the lower actuation electrode 742, and a second actuation-electrode via 770B, in direct electrical contact with the upper actuation electrode 743.

The detection vias 765 may be used to connect in series the detection units 750 and, together with the actuation vias 770, are useful for connecting the actuation structure 740 with the driving circuit and for connecting the detection structure 745 with the sensing circuit.

In use, the piezoelectric MEMS actuator 700 has a similar functioning to the piezoelectric MEMS actuator 500, 600, 650, 680. However, here, the passivation region 760 is made of an oxide, either a single layer or a multilayer comprising, for example, TEOS, alumina or undoped silicate glass (USG), which are less rigid than aluminum nitride, which is used to form the passivation region 550 of the piezoelectric MEMS actuator 500. Therefore, the piezoelectric actuation region 741 is less constrained and is more deformable, at a same bias voltage, than the actuation structure 535, thereby increasing the sensitivity of the piezoelectric MEMS actuator 700.

Hereinbelow, the fabrication of the piezoelectric MEMS actuator 700 is described, according to an embodiment. For clarity, FIGS. 20-26 show enlarged cross-sections of half of the piezoelectric MEMS actuator 700 in successive manufacturing steps. However, the manufacturing of the whole piezoelectric MEMS actuator 700 would be clear to the person skilled in the art, given the symmetry of the piezoelectric MEMS actuator 700 described hereinabove.

Figure 20:
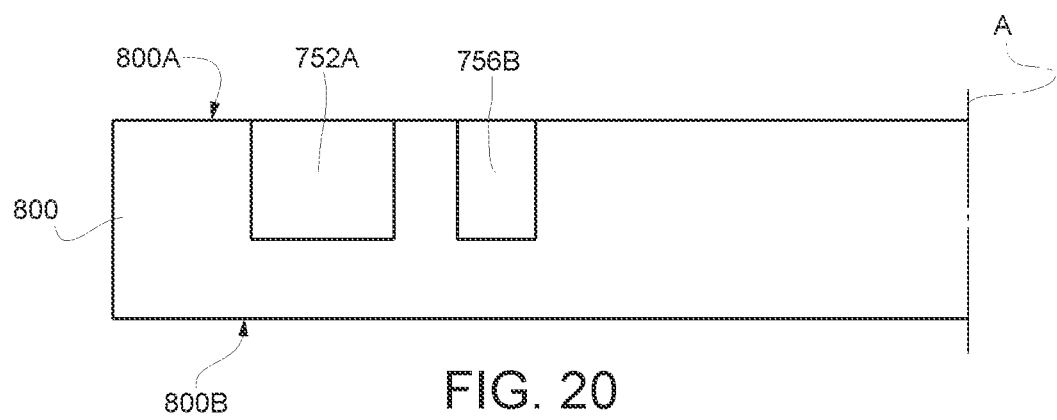
FIGS. 20-27 show cross-sections of the piezoelectric MEMS actuator of FIG. 19, in successive manufacturing steps.

FIG. 20 shows a first wafer 800 of semiconductor material (intended to form the structural layer 735) having a first and a second surface 800A, 800B. In detail, the first and the second doped regions 752A, 756B have already been formed in the first wafer 800 and extend from the first surface 800A of the first wafer 800. For example, the first and the second doped regions 752A, 756B are formed by implantation of doping ions through the first surface 800A. In this embodiment, the first and the second doped regions 752A, 756B have a same thickness, for example, comprised between 5 µm and 40 µm.

Figure 21:
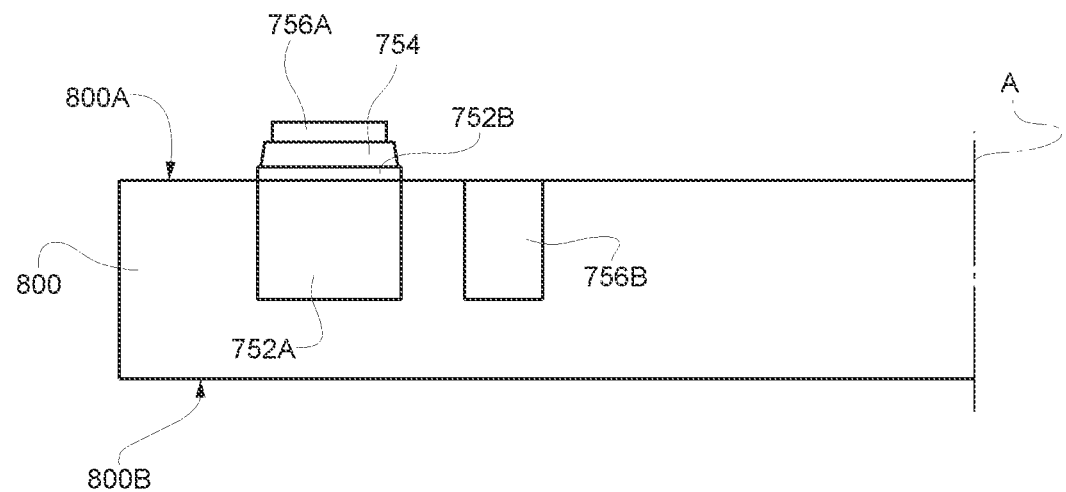

In FIG. 21, the first metallic region 752B, the piezoelectric detection region 754 and the second metallic region 756A are formed, in a per se known way, on the first surface 800A of the first wafer 800, on the first doped region 752A.

Figure 22:
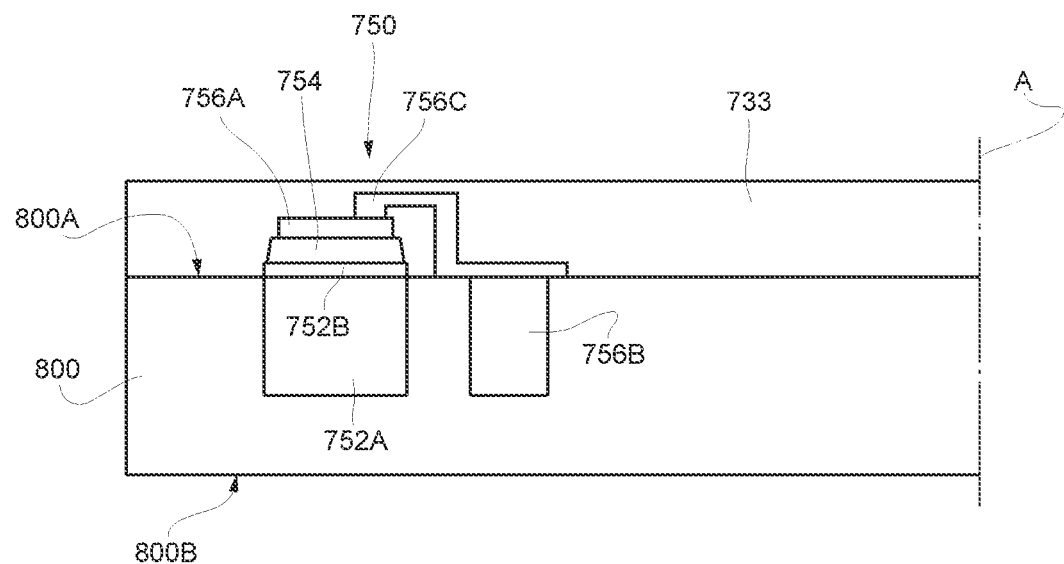

Then, FIG. 22, the conducting via 756C and the first insulating layer 733 are formed on the first surface 800A of the first wafer 800, for example, through lithographic, etching and deposition steps. Therefore, the detection units 750 are formed.

Figure 23:
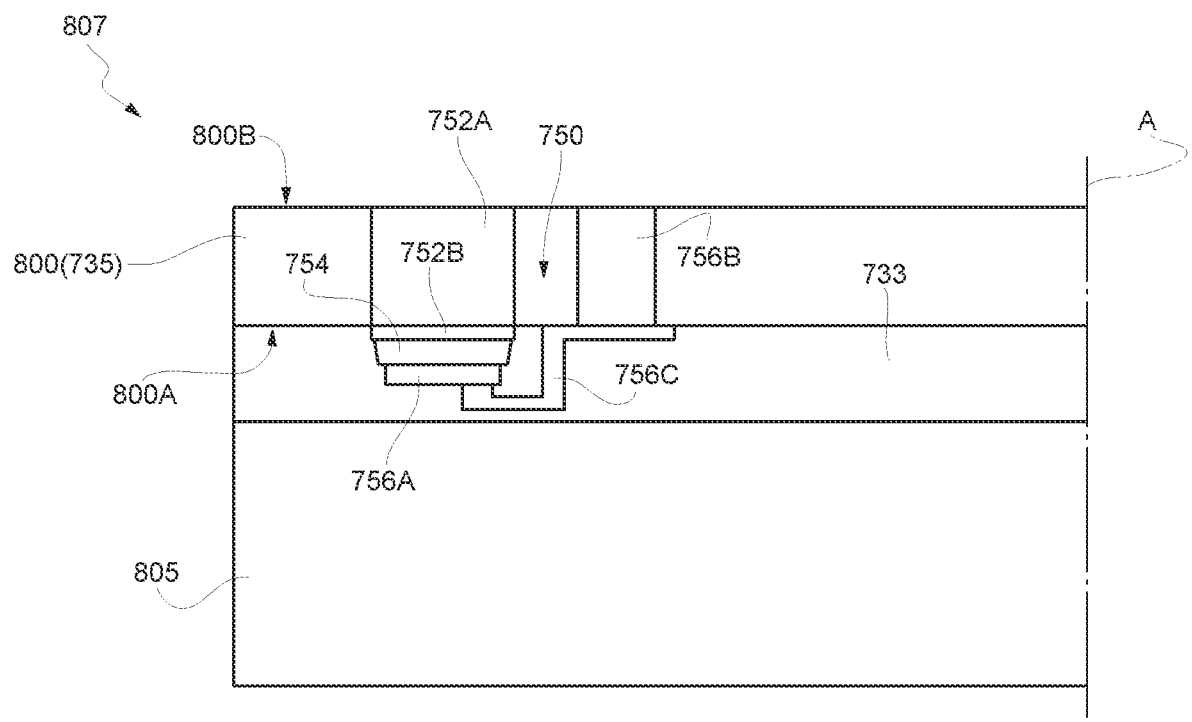

Subsequently, FIG. 23, a second wafer 805 of semiconductor material (intended to form the substrate 730) is bonded to the first insulating layer 733.

The first wafer 800, the first insulating layer 733 and the second wafer 805 form a work structure 807.

The work structure 807 is flipped upside-down and thinned, for example, through grinding, on the second surface 800B of the first wafer 800, to expose the first and the second doped regions 752A, 756B. The remaining portion of the first wafer 800 forms the structural layer 735.

Figure 24:
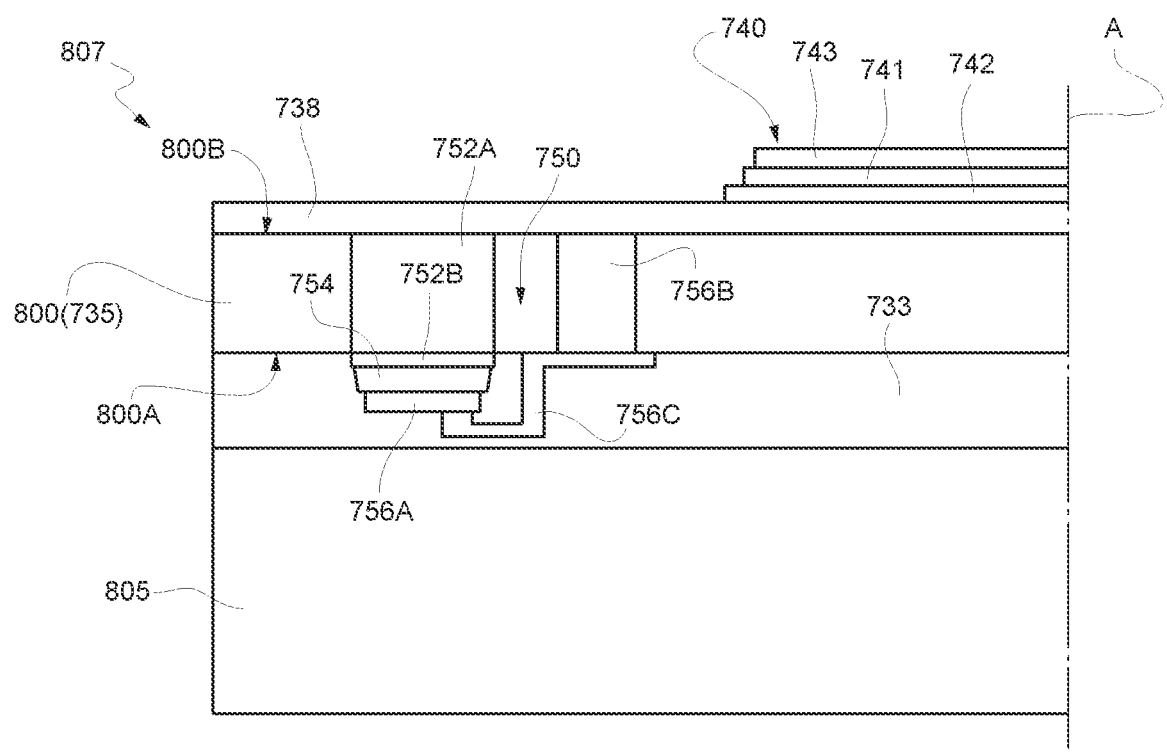

In FIG. 24, the second insulating layer 738 is deposited on the second surface 800B of the first wafer 800 and the stack, which constitutes the actuation structure 740 and includes the lower actuation electrode 742, the piezoelectric actuation region 741 and the upper actuation electrode 743, is formed on the second insulating layer 738, similarly to FIGS. 4 and 5.

Figure 25:
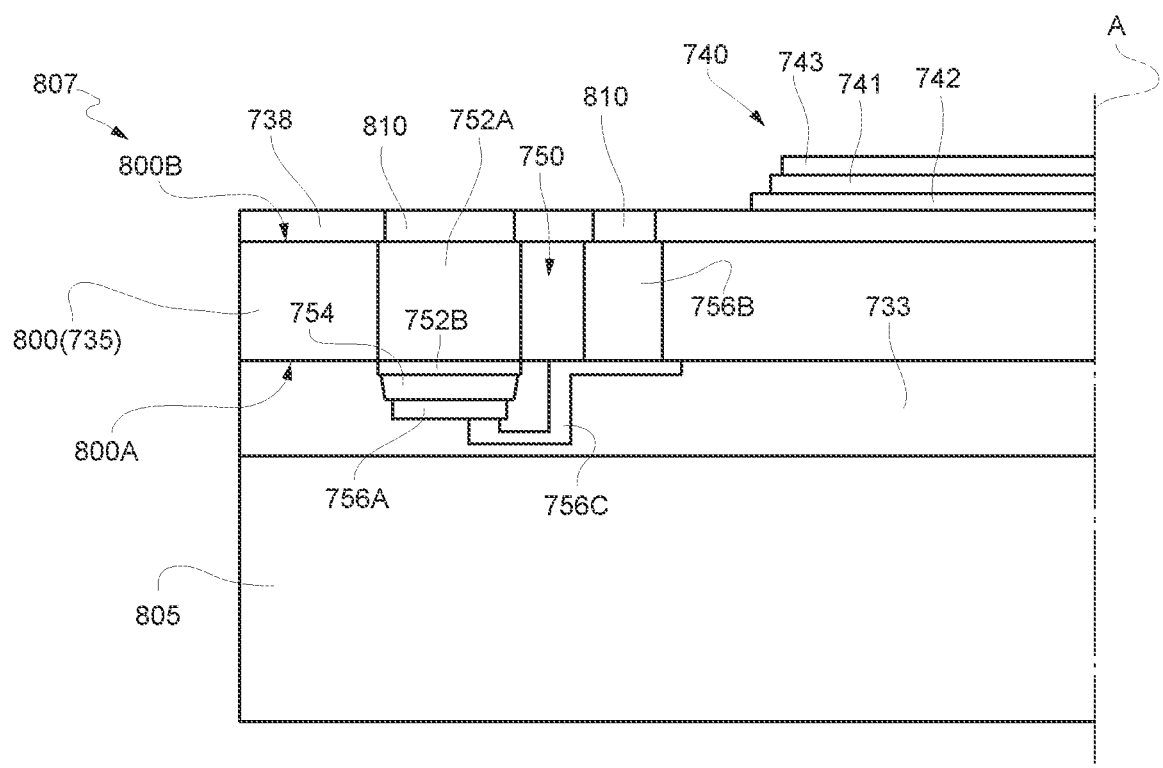

Subsequently, FIG. 25, first conductive vias regions 810 are formed in the second insulating layer 738, in direct electrical contact with the first and the second doped regions 752A, 756B.

Figure 26:
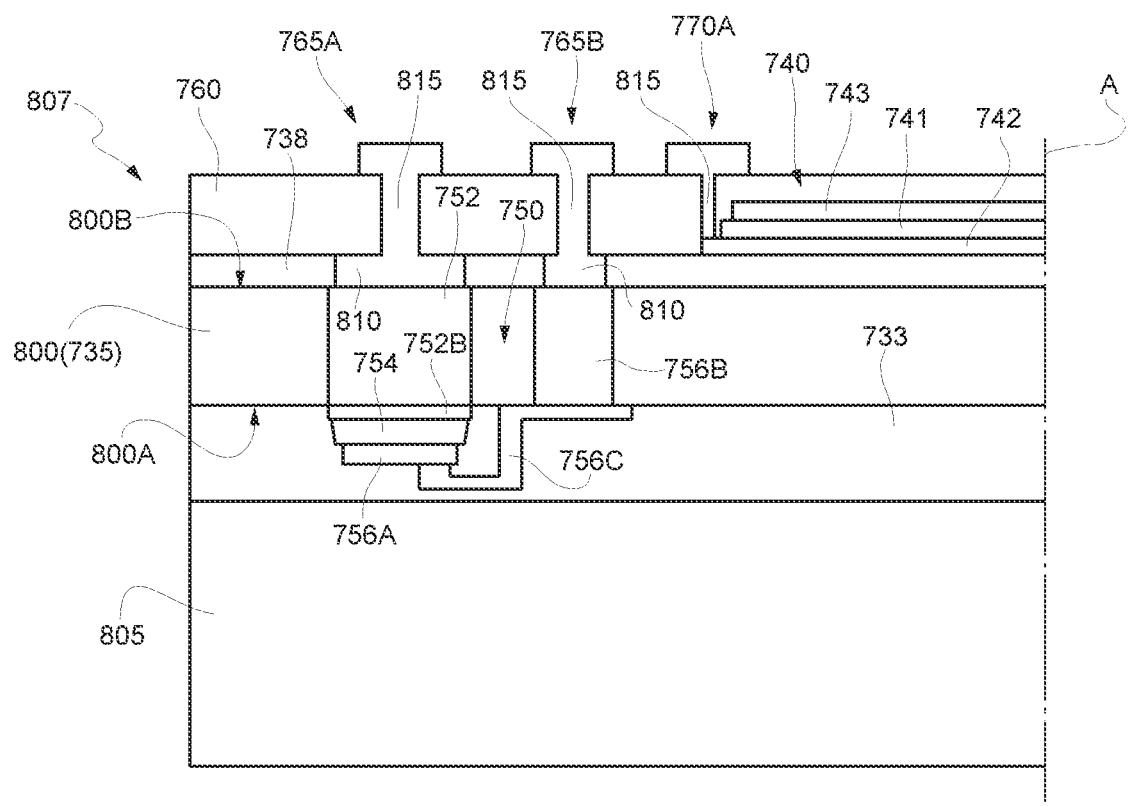

In FIG. 26, the passivation region 760 is formed and covers the second insulating layer 738, the first conductive vias regions 810 and the actuation structure 740. Furthermore, second conductive vias regions 815 are formed through the passivation region 760, so to be in contact with the first conductive vias regions 810 (thus forming the detection vias 765) or to be in contact with the lower and upper actuation electrode 742, 743 (thus forming the actuation vias 770).

Figure 27:
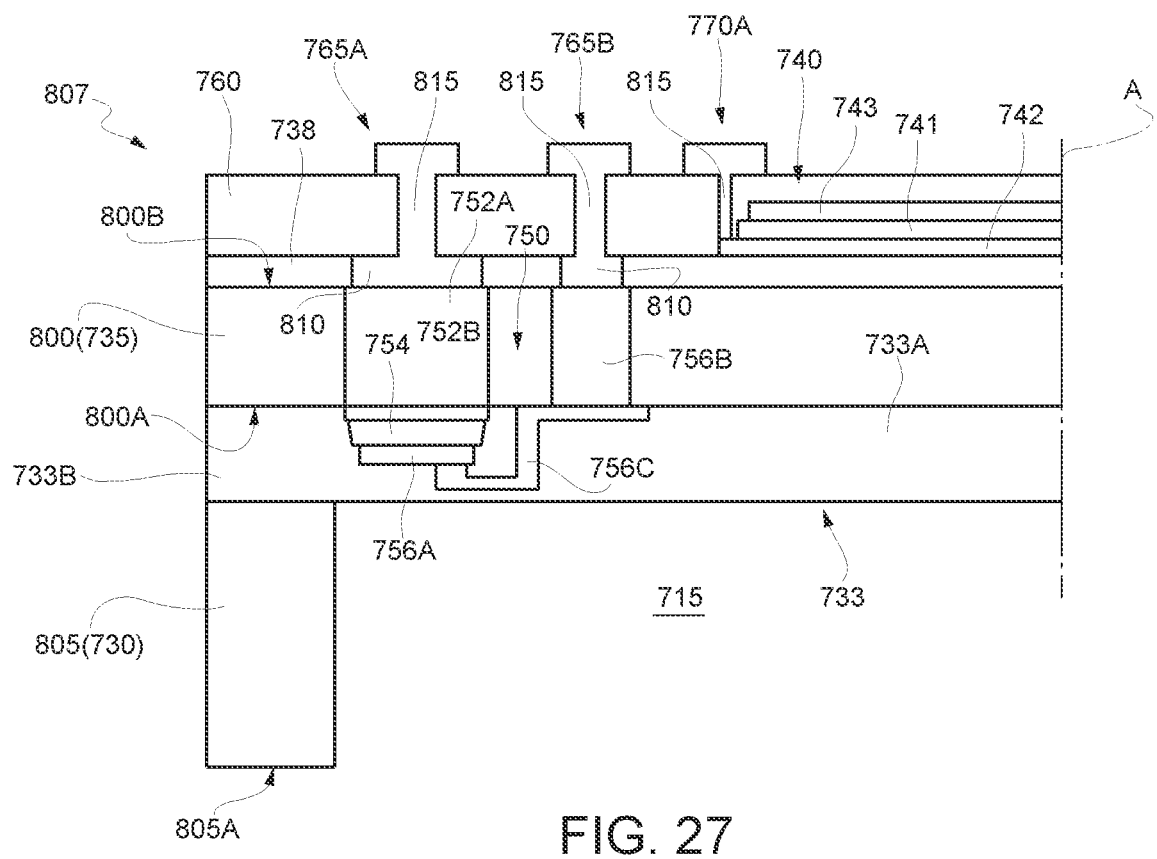

Then, FIG. 27, the second wafer 805 is selectively etched, from an exposed surface 805A, up to the first insulating layer 733, thus forming the cavity 715. The remaining portion of the second wafer 805, which laterally delimits the cavity 715, forms the substrate 730.

The work structure 807 is then diced and each die, after usual electrical connection and packaging steps, forms the piezoelectric MEMS actuator 700.

By virtue of the manufacturing steps shown in FIGS. 20-27, the actuation structure 740 and the detection structure 745 are integrated on separate portions of the piezoelectric MEMS actuator 700. Therefore, the manufacturing steps employed to obtain the detection structure 745 and the actuation structure 740 do not interfere with each other, thus allowing a better control and reliability of the whole manufacturing process.

Figure 28:
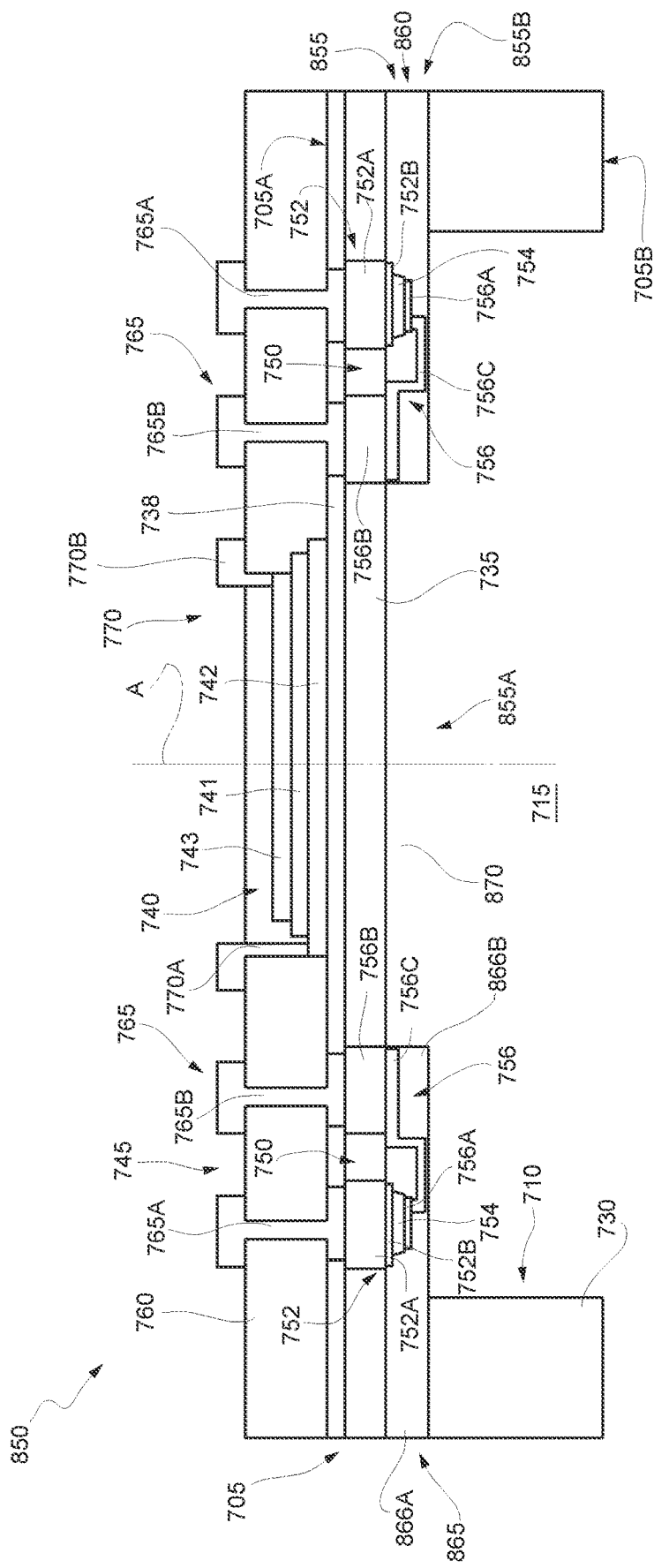
FIG. 28 shows a cross-section of a different embodiment of the present piezoelectric MEMS actuator.

FIG. 28 shows a different embodiment of the present piezoelectric MEMS actuator, here indicated by 850. The piezoelectric MEMS actuator 850 has a structure similar to the piezoelectric MEMS actuator 800; therefore elements in common are designated with the same reference numbers.

In detail, also the piezoelectric MEMS actuator 850 is formed in the die 705, which comprises the bearing portion 710 and a deformable structure 855, which is formed by a movable portion 855A and a fixed portion 855B, and comprises the actuation structure 740 and the detection structure 745.

The die 705 is formed by a multilayer structure 860 which includes the substrate 730, which surrounds the cavity 715, a first insulating layer 865 and the structural layer 735.

The first insulating layer 865 has a first portion 866A extending on the substrate 730 and a second portion 866B extending over the cavity 715.

A lightening cavity 870 extends from the cavity 715, in communication therewith, through a central portion of the first insulating layer 865, up to the structural layer 735, underneath the actuation structure 740.

The piezoelectric MEMS actuator 850 has, in use, improved reliability. In fact, in use, when the deformable structure 855 is subject to deformation, the absence of the first insulating layer 865 underneath the actuation structure 740, avoids the risk of delamination and/or break of the first insulating layer 865, which may be caused by the mechanical stress.

The piezoelectric MEMS actuator 850 may be manufactured by similar steps as the ones shown in FIGS. 20-27 and described hereinabove for the piezoelectric MEMS actuator 700.

In detail, the piezoelectric MEMS actuator 850 may be manufactured starting from the first wafer 800 of FIG. 20 and performing the steps shown in FIGS. 21 and 22 and described above.

Figure 29:
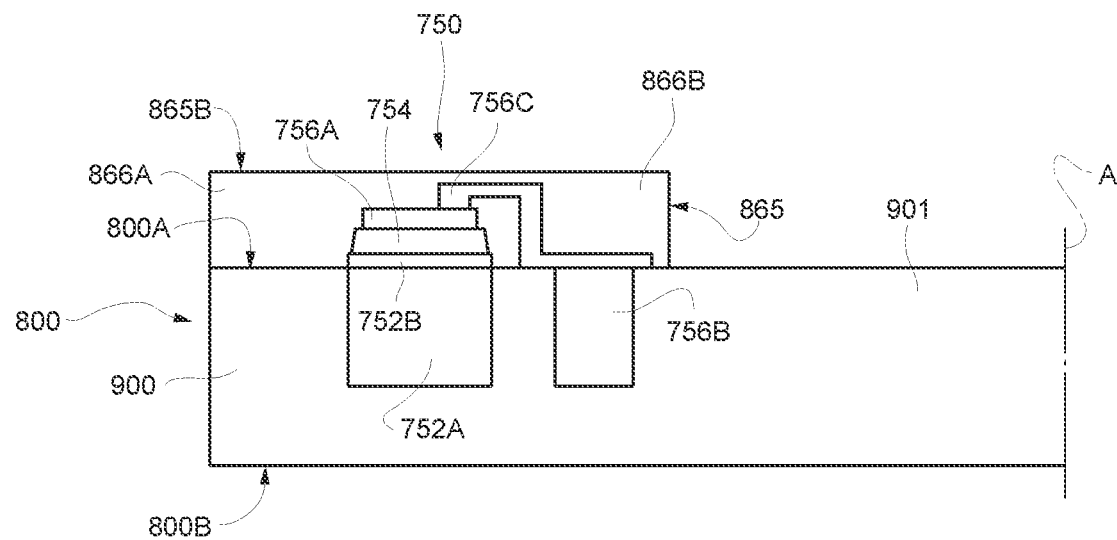
FIGS. 29 and 30 show cross-sections of the piezoelectric MEMS actuator of FIG. 28, in intermediate manufacturing steps.

Then, FIG. 29, the first insulating layer 733 is selectively removed from the first surface 800A of the first wafer 800, so to cover only a peripheral portion 900 of the first wafer 800 and the detection units 750, and to expose a central portion 901 of the first wafer 800.

Figure 30:
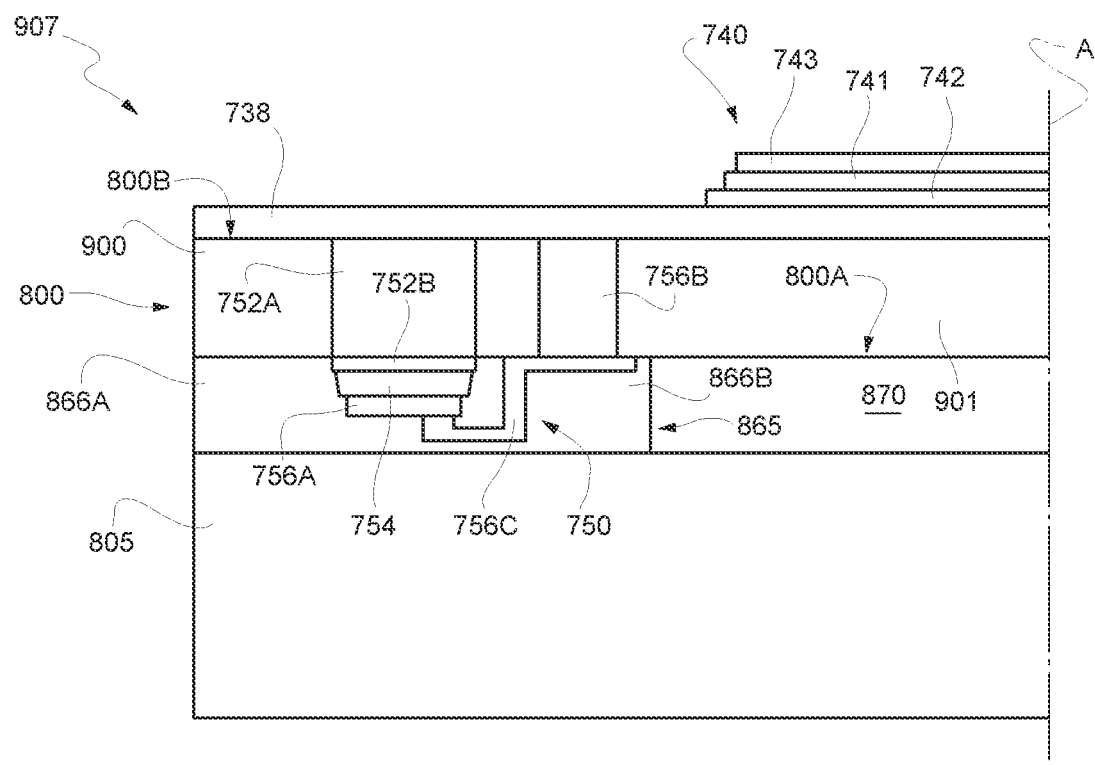

Subsequently, FIG. 30, the second wafer 805 is bonded to the first insulating layer 865, forming a work structure 907 comprising the lightening cavity 870.

The work structure 907 is then flipped upside-down, the first wafer 800 is thinned, similarly to what described with reference to FIG. 23 and the second insulating layer 738 and the actuation structure 740 are formed.

The final fabrication steps are then performed to obtain the piezoelectric MEMS actuator 850, similarly to what described above for the piezoelectric MEMS actuator 700.

Finally, it is clear that modifications and variations may be made to the piezoelectric MEMS actuator 150, 350, 500, 600, 850, 680, 700, 850, to the microfluidic valve 300, 400, to the method for controlling the microfluidic valve and to the fabrication method described and illustrated herein without thereby departing from the scope of the present disclosure, as defined in the attached claims.

For example, the different embodiments described may be combined so as to provide further solutions.

For example, the deformable structure 105 may be formed by structures other than a membrane, for example, by a cantilever, a diaphragm or a structure with a particular conformation, usable in specific applications.

The active actuation structure 65 may have bimorph behavior using a unimorph material, as, for example, described in European patent application EP 3441358A1.

The layers forming the deformable structure and the constriction structure may have different thicknesses, according to the desired deformation and application.

Furthermore, the fluidic channel may have a different shape.

The control unit 320 may be integrated in the piezoelectric MEMS actuator 150 or in the body 290; 390, or be formed by a standalone device, for example, an ASIC.

Furthermore, the lower actuation electrode and the lower detection electrode of the piezoelectric MEMS actuator 150, 350 may be formed by distinct conductive regions.

Figure 31:
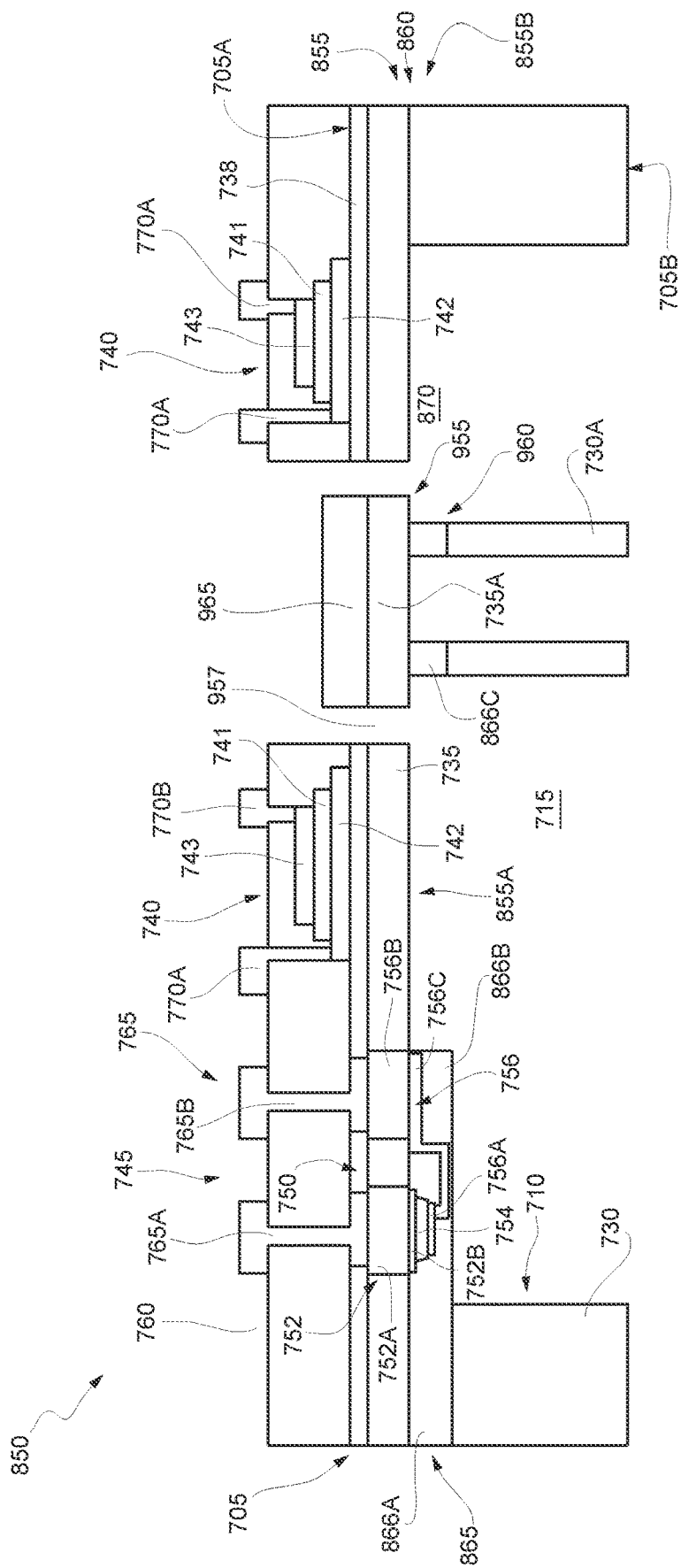
FIG. 31 shows a cross-section of a further embodiment of the present piezoelectric MEMS actuator.

For example, it is clear that the manufacturing process of the piezoelectric MEMS actuator 700, 850 described hereinabove may be modified, in a known way, to obtain different piezoelectric MEMS actuators, for example, a MEMS micromirror, as shown in FIG. 31.

Here, the deformable structure 855 of the piezoelectric MEMS actuator, indicated by 950, comprises also a movable structure 955 suspended in a pass-through cavity 957 through elastic structures, here not shown but per se known.

The movable structure 955 is formed in the multilayer structure 860 by a portion 735A of the structural layer 735.

In this embodiment, the movable structure 955 comprises stiffening pillars 960, which extend in the cavity 715 and in the lightening cavity 870, and which are here formed by bonding portions 866C of the first insulating layer 865 and by stiffening portions 730A of the substrate 730.

The piezoelectric MEMS actuator 950 further comprises a reflective region 965, for example, of metal such as gold or aluminum, or formed by a stack of dielectric materials, which extends on the movable structure 955, on the portion 735A of the structural layer 735, and is configured to reflect a light beam impinging thereto.

In use, a bias voltage may be applied to the actuation structure 740 to cause a deformation of the deformable structure 855, as explained above, and consequently a rotation of the movable structure 955, in a known way, so that the light beam that impinges on the reflective region 960 may be reflected along a desired direction, for example, either mono- or bi-directionally.

The various embodiments described above can be combined to provide further embodiments. Aspects of the embodiments can be modified, if necessary to employ concepts of the various patents, applications and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A micro-electromechanical structure (MEMS) actuator, comprising:
a substrate surrounding a cavity;
a deformable structure suspended on the cavity;
an actuation structure that includes:
a first piezoelectric region of a first piezoelectric material, supported by the deformable structure and configured to cause a deformation of the deformable structure; and
a detection structure that includes:
a second piezoelectric region of a second piezoelectric material, supported by the deformable structure and configured to detect the deformation of the deformable structure.

2. The actuator according to claim 1, further comprising a passivation region, which surrounds the actuation structure and is formed of the second piezoelectric material.

3. The actuator according to claim 1, wherein the first piezoelectric material is different from the second piezoelectric material.

4. The actuator according to claim 1, wherein the substrate includes a first side that is spaced from a second side by the cavity, and the deformable structure includes a support layer that extends from the first side to the second side, a stiffening layer is on a first surface of the support layer and the actuation structure is on a second surface of the support layer.

5. The actuator according to claim 1, wherein the actuation structure includes a lower actuation electrode, the first piezoelectric region and an upper actuation electrode and the detection structure includes a lower detection electrode, the second piezoelectric region and an upper detection electrode.

6. The actuator according to claim 5, wherein the lower actuation electrode and the lower detection electrode are a single conductive region.

7. The actuator according to claim 1, wherein the deformable structure has a first and a second surface, opposite to each other, the actuation structure is arranged on the first surface and the actuator includes a constriction structure formed by a protruding region arranged on the second surface.

8. The actuator according to claim 7, wherein the constriction structure extends into the cavity.

9. The actuator according to claim 1, wherein a pass-through cavity extends through a central portion of the deformable structure.

10. The actuator according to claim 1, wherein the detection structure includes a test detection structure on the actuation structure.

11. The actuator according to claim 1, wherein the detection structure is buried in the deformable structure.

12. The actuator according to claim 11, wherein the deformable structure includes an insulating layer and a structural layer, the structural layer being of semiconductor material on the insulating layer, and a lightening cavity extends from the cavity through the deformable structure to the structural layer, the lightening cavity being laterally delimited by the insulating layer.

13. A microfluidic valve comprising:
a body;
a fluidic channel inside the body having a constriction portion defining a passage having a passage section;
a micro-electromechanical structure (MEMS) actuator including:
a substrate surrounding a cavity;
a deformable structure suspended on the cavity;
a first piezoelectric actuation region of a first piezoelectric material, supported by the deformable structure and configured to cause a deformation of the deformable structure, the first piezoelectric actuation region is coupled to the constriction portion and is configured to modify the passage section; and
a second piezoelectric detection region of a second piezoelectric material, supported by the deformable structure and configured to detect the deformation of the deformable structure; and
a control unit, coupled to the MEMS actuator and configured to provide the first piezoelectric actuation region with a bias voltage and to receive a detection voltage from the second piezoelectric detection region.

14. The microfluidic valve according to claim 13, wherein the fluidic channel includes an inlet portion and an outlet portion, the constriction portion is arranged between the inlet portion and the outlet portion and a constriction element in the constriction portion, coupled to the second piezoelectric detection region and configured to modify the passage section in response to the deformation of the second piezoelectric detection region.

15. The microfluidic valve according to claim 13, wherein the fluidic channel further comprises an opening extending transversely to an inlet portion that is spaced from an outlet portion by the constriction element and a protrusion of the constriction element is extending from a wall of the fluidic channel through the opening and has an end facing, at a distance, the first piezoelectric actuation region to form the passage.

16. The microfluidic valve according to claim 15, wherein the body has a bonding face; the MEMS actuator is bonded to the bonding face of the body; the opening extends from the inlet and the outlet portions of the fluidic channel to the bonding face; the cavity of the MEMS actuator faces and is in fluidic connection with the opening.

17. A method, comprising:
controlling a microfluidic valve that includes a fluidic channel having a constriction portion including a passage, a micro-electromechanical structure (MEMS) actuator that has a first piezoelectric actuation region of a first piezoelectric material and a second piezoelectric detection region of a second piezoelectric material, the first piezoelectric actuation region is coupled to the constriction portion and is configured to modify the passage section, and a control unit, coupled to the MEMS actuator;
providing, by the control unit, the first piezoelectric actuation region with a bias voltage generating a nominal flow in the fluidic channel;
providing, by the second piezoelectric detection region, the control unit with a detection voltage between a lower detection electrode and a upper detection electrode, the detection voltage corresponding to a measured flow amount;
comparing an electrical quantity corresponding to the detection voltage with a value corresponding to an amount of the nominal flow; and
applying a new bias voltage in response to the measured flow amount being different from the nominal flow amount.

18. A method of fabricating a MEMS actuator, comprising:
forming a cavity and a deformable structure in a substrate of a semiconductor material wafer;
forming an actuation structure including a first piezoelectric region, of a first piezoelectric material, supported by the deformable structure; and
forming a detection structure including a second piezoelectric region, of a second piezoelectric material, supported by the deformable structure.

19. The fabrication method according to claim 18, wherein:
forming the actuation structure further comprises:
forming a lower actuation electrode region from a first conductive layer;
forming the first piezoelectric region, on the lower actuation electrode region, from a first piezoelectric layer; and
forming an upper actuation electrode region, on the first piezoelectric region, from a second conductive layer; and
forming the detection structure, further comprises:

forming a lower detection electrode region from the first conductive layer;

forming the second piezoelectric region, on the lower detection electrode region, from a second piezoelectric layer; and forming an upper detection electrode region, on the second piezoelectric region, from a third conductive layer.

20. The fabrication method according to claim 19, wherein forming the second piezoelectric region comprises depositing the second piezoelectric layer and defining the second piezoelectric layer, forming the second piezoelectric region and a passivation region surrounding the actuation structure.

21. The fabrication method according to claim 18, wherein forming the cavity in the substrate, further comprises:

forming, on a first surface of the substrate, a shaping region;

forming, on the shaping region, a stiffening region;

forming, on the stiffening region, a structural layer; and forming a constriction structure protruding from the structural layer towards the cavity by selectively removing the substrate from a second surface to the shaping region, opposite to the first surface.

* * * * *